United States Patent
Boukai

(10) Patent No.: US 9,362,015 B2
(45) Date of Patent: Jun. 7, 2016

(54) SILICON-BASED SOLAR CELL WITH EUTECTIC COMPOSITION

(75) Inventor: Akram Boukai, Ann Arbor, MI (US)

(73) Assignee: The Regents Of The University Of Michigan, Ann Arbor, MI (US)

(*) Notice: Subject to any disclaimer, the term of this patent is extended or adjusted under 35 U.S.C. 154(b) by 1208 days.

(21) Appl. No.: 13/328,621

(22) Filed: Dec. 16, 2011

(65) Prior Publication Data

US 2012/0152354 A1     Jun. 21, 2012

Related U.S. Application Data

(60) Provisional application No. 61/423,895, filed on Dec. 16, 2010.

(51) Int. Cl.

| | |
|---|---|
| *H01B 1/04* | (2006.01) |
| *C22C 23/00* | (2006.01) |
| *H01M 4/38* | (2006.01) |
| *H01L 31/0288* | (2006.01) |
| *H01L 31/0352* | (2006.01) |
| *H01L 31/072* | (2012.01) |
| *H01L 31/18* | (2006.01) |

(52) U.S. Cl.
CPC ............ *H01B 1/04* (2013.01); *H01L 31/0288* (2013.01); *H01L 31/03529* (2013.01); *H01L 31/072* (2013.01); *H01L 31/1804* (2013.01); *H01M 4/386* (2013.01); *Y02E 10/547* (2013.01); *Y02P 70/521* (2015.11)

(58) Field of Classification Search
CPC ............ H01B 1/04; H01M 4/386; C22F 1/06; C22C 23/00; C22C 47/00
See application file for complete search history.

(56) References Cited

U.S. PATENT DOCUMENTS

| | | | |
|---|---|---|---|
| 5,326,719 A | 7/1994 | Green et al. | |
| 5,551,996 A * | 9/1996 | Adachi | C22C 23/04 148/420 |
| 6,146,584 A * | 11/2000 | Park | C22C 23/02 148/420 |
| 6,664,631 B2 | 12/2003 | Meier et al. | |
| 2009/0020148 A1 | 1/2009 | Boukai et al. | |
| 2009/0117741 A1 | 5/2009 | Heath et al. | |
| 2010/0237272 A1 | 9/2010 | Chaudhari et al. | |
| 2013/0019918 A1 | 1/2013 | Boukai et al. | |

(Continued)

FOREIGN PATENT DOCUMENTS

| | | |
|---|---|---|
| WO | WO 2012/083191 | 6/2012 |
| WO | 2013012842 A1 | 1/2013 |

OTHER PUBLICATIONS

Liu et al "The solidification process of Al—Mg—Si alloys", Journal of Materials Science 32 (1997) 1443-47.*
Li et al "Magnesium silicide intermetallic alloys", Metallurgical Transactions A 24A, 2383-91 (1993).*
International Search Report and Written Opinion of the International Searching Authority issued on Aug. 24, 2012 in related cross-referenced PCT International Application No. PCT/US11/65537 (published as WO 2012/083191).
Liu, Zhengxin, et al., "A thin-film solar cell of high-quality β-FeSi$_2$/Si heterojunction prepared by sputtering," Solar Energy Materials & Solar Cells, vol. 90, pp. 276-282 (2006) (published online May 10, 2005).

*Primary Examiner* — Mark Kopec
(74) *Attorney, Agent, or Firm* — Harness, Dickey & Pierce, PLC

(57) ABSTRACT

Growth and characterization of low cost, and high efficiency micro- and nanostructured p-n heterojunction solar cells through eutectic solidification are provided. Eutectic solidification results in self-assembly of lamellar or rod-like domains with length scales from hundreds of nanometers to micrometers that can be used for efficient extraction of minority carriers in metallurgical-grade materials. The material having a eutectic or near-eutectic composition can be used in making a low-cost and efficient inorganic solar cell.

22 Claims, 13 Drawing Sheets

(56) References Cited

U.S. PATENT DOCUMENTS

Figure 1:
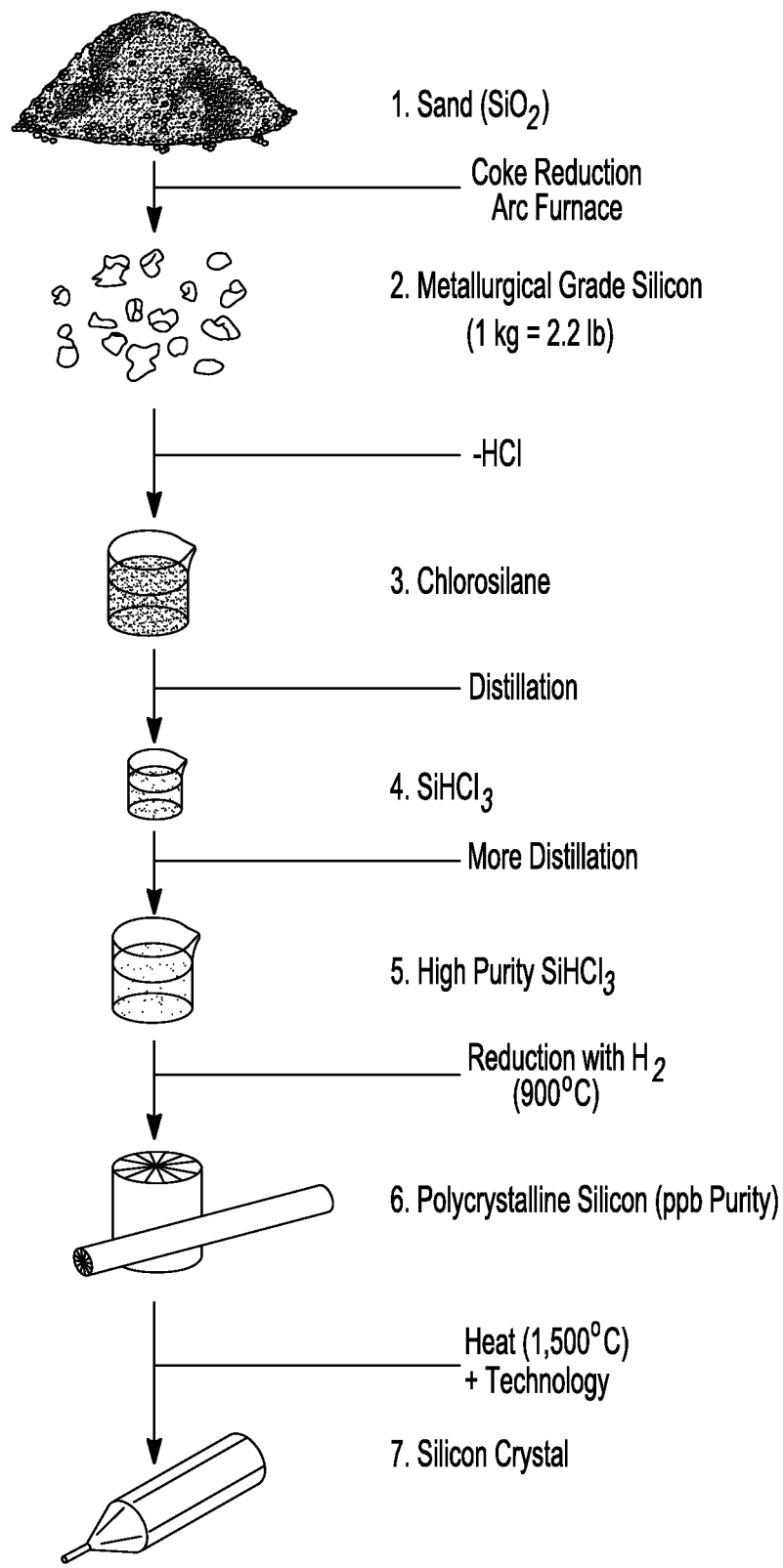

| | | | | |
|---|---|---|---|---|
| 2013/0196158 A1* | 8/2013 | Yoshida | ............... | H01M 4/364 428/402 |
| 2014/0290804 A1* | 10/2014 | Bauer | ................ | C22C 28/00 148/404 |
| 2014/0370386 A1* | 12/2014 | Hirono | ................ | H01M 4/386 429/220 |
| 2015/0228883 A1 | 8/2015 | Boukai et al. | | |
| 2015/0280099 A1 | 10/2015 | Boukai et al. | | |
| 2015/0325772 A1 | 11/2015 | Boukai et al. | | |

* cited by examiner

Preliminary Data

SILICON-BASED SOLAR CELL WITH EUTECTIC COMPOSITION

CROSS-REFERENCE TO RELATED APPLICATIONS

This application claims the benefit of U.S. Provisional Application No. 61/423,895, filed on Dec. 16, 2010. The entire disclosure of the above application is incorporated herein by reference.

FIELD

The present technology relates to silicon-based solar cells with eutectic compositions, including highly efficient cells and all inorganic cells.

INTRODUCTION

Solar cells are attractive electric power generators since they are a source of clean energy. The most common material used in solar cells is silicon. Single-crystal and multi-crystalline silicon accounts for over 90% of the solar cell market. That number increases to almost 98% if amorphous silicon cells are counted. The primary reason for silicon's dominance of the solar cell industry is its earth abundance and ease of processing. Crystalline silicon solar cells have achieved efficiencies approaching 25% in the laboratory and 20% commercially. Currently, however, the United States receives less than 1% of its electrical power from photovoltaic or solar cells. The reason is that crystalline silicon solar cell manufacture and installation remains prohibitively expensive.

One of the reasons for the high cost of crystalline silicon is the expense required to purify metallurgical-grade silicon (99.9-99.999% pure) to solar-grade silicon (99.999999% pure), so that is it suitable for use in a solar or photovoltaic cell. The purification process accounts for over 40% of the completed cell cost and is required to remove the detrimental metallic impurities found in the raw silicon feedstock. If solar cells are to become commercially competitive, the ultimate goal is to achieve a price per watt ratio under $1/W. Thus, more efficient and less costly methods of manufacturing purified, high quality materials for use in photovoltaic or solar cells are required.

SUMMARY

The present technology includes systems, methods, articles, and compositions that relate to the manufacture, growth, and use of low cost and high efficiency micro- and nanostructured p-n heterojunction solar cells through eutectic solidification. Eutectic solidification promotes the self-assembly of lamellar or rod-like domains with length scales from hundreds of nanometers to micrometers, which are ideal for the efficient extraction of minority carriers in metallurgical-grade (impure) materials. Materials can be constructed with a eutectic or near-eutectic composition to provide efficient and inorganic solar cells. Earth abundant metallurgical grade materials with such eutectic or near-eutectic compositions allow for the development of low-cost and high efficiency solar cells.

In some embodiments, materials are provided that comprise eutectic or near-eutectic compositions comprising silicon and a metal silicide having lamellar architecture. Thus, a material comprising a eutectic or near-eutectic composition may have a first phase comprising silicon (Si) and a second phase comprising a metal silicide. The first phase and the second phase together define a lamellar architecture in the material.

In some embodiments, methods of making materials comprise heating a mixture comprising a metal and silicon at a temperature to melt the metal. The mixture comprises the metal and silicon at weight percentages having a eutectic or near-eutectic point or a eutectoid or near-eutectoid point. The mixture is then cooled to form a eutectic composition comprising the silicon and a metal silicide having lamellar architecture.

In certain embodiments, a method of making a material is provided that comprises heating a mixture comprising a first material comprising silicon (Si) and a second material comprising a metal. The mixture comprises silicon and metal in amounts of a eutectic composition or a near-eutectic composition. The mixture is thus heated to a temperature that is greater than or equal to a eutectic point temperature or a eutectoid point temperature for the mixture, so as to melt the metal. The method also include cooling the mixture to form a eutectic or near-eutectic composition comprising a first phase comprising silicon and a second phase comprising a metal silicide. The first phase and the second phase together define a lamellar architecture in the eutectic or near-eutectic composition.

In some embodiments, methods of generating an electric current comprise illuminating a photovoltaic cell. The photovoltaic cell comprises a material including a eutectic composition comprising silicon and a metal silicide having lamellar architecture. The photovoltaic cell is coupled to an electrical circuit.

In yet other embodiments, a method of generating an electric current is provided that comprises illuminating a photovoltaic cell. The photovoltaic cell comprises a material having a eutectic or a near-eutectic composition having a first n-type phase comprising silicon (Si) and a second p-type phase comprising a metal silicide, where the first phase and the second phase together define a lamellar architecture in the material. The method thus further includes coupling the photovoltaic cell to an electrical circuit.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 1. Illustrated are the various steps required in a conventional process to transform $SiO_2$ to solar-grade silicon.

Figure 2A:
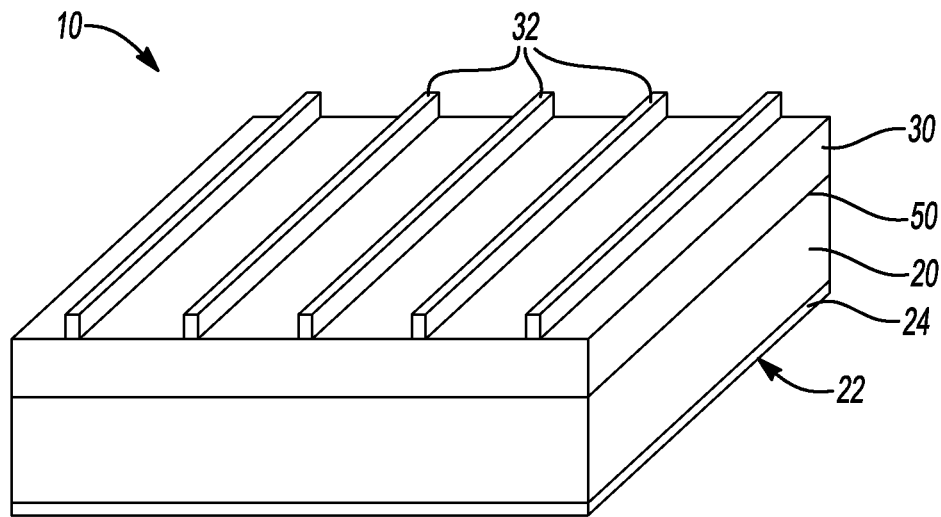

FIG. 2. (a) A schematic showing the geometry of a typical planar p-n junction solar cell. The metallic leads make ohmic contact to the silicon. (b) Energy band diagram of a p-n junction. The bandgap energy is denoted as $E_g$. Photons with energy, $h\nu > E_g$, excite electron-hole pairs that subsequently become separated at the junction. The junction acts as a "membrane" for electron-hole separation. The electrons (black circles) relax to the conduction band edge via collisions with phonons. They diffuse to the n-type silicon since their quasi-chemical potential, $E_{Fn}$, is lower there. Holes relax to the valence band edge via collisions with phonons.

They diffuse to the p-type silicon since their quasi chemical potential, $E_{Fp}$, is lower there. A voltage appears across the load resistor, $R_L$, given by $V_{out}$.

FIG. 3. (a) A schematic showing the typical planar p-n junction solar cell. Electrons (black dot) at a distance from the junction that is larger than the diffusion length are not collected. (b) A lamellar p-n junction with a smaller collection distance. This geometry increases the probability of carrier collection.

FIG. 4. (a) A two-dimensional model of lamellar nanostructured p-n junctions. The internal quantum efficiency (IQE) increases favorably as the lamellar spacing between each heterojunction decreases. The internal quantum efficiency eventually plateaus at a value of 350 nm and then decreases sharply. (b) A cross-section of the natural logarithm of carrier density for electrons (410), and holes (420) through one junction for Regimes 1, 2, and 3, in (a).

Figure 5:
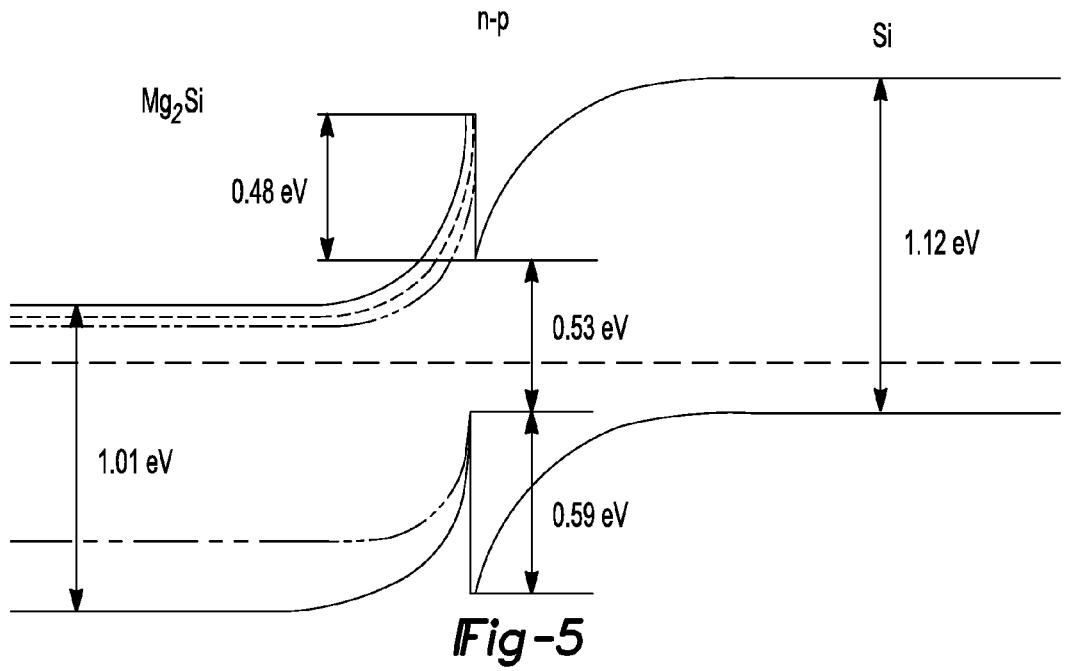

FIG. 5. A band diagram of an n-type $Mg_2Si$-p-type Si heterojunction. Band bending at the interface between both materials indicates that charge separation is possible.

FIG. 6. (a) Experimental data of I-V characteristics on a planar n-type $Mg_2Si$-p-type Si heterojunction in the dark (610) and under 1 sun, AM 1.5 illumination (620). The device exhibits a photovoltaic effect under illumination with an open-circuit voltage of 0.45V. (b) Experimental data of I-V control experiments show if the photovoltaic effect in (a) arises from the heterojunction or is an artifact of a Schottky contact between the semiconductors with the metal rear contact or wire bonding. The control experiments show nearly ohmic behavior and no photovoltaic effect is observed, thus indicating that the heterojunction is responsible for the charge separation. (c) Experimental data of I-V characteristics on a planar n-type $\beta$-$FeSi_2$-p-type Si heterojunction, which exhibits a photovoltaic effect as well.

Figure 7:
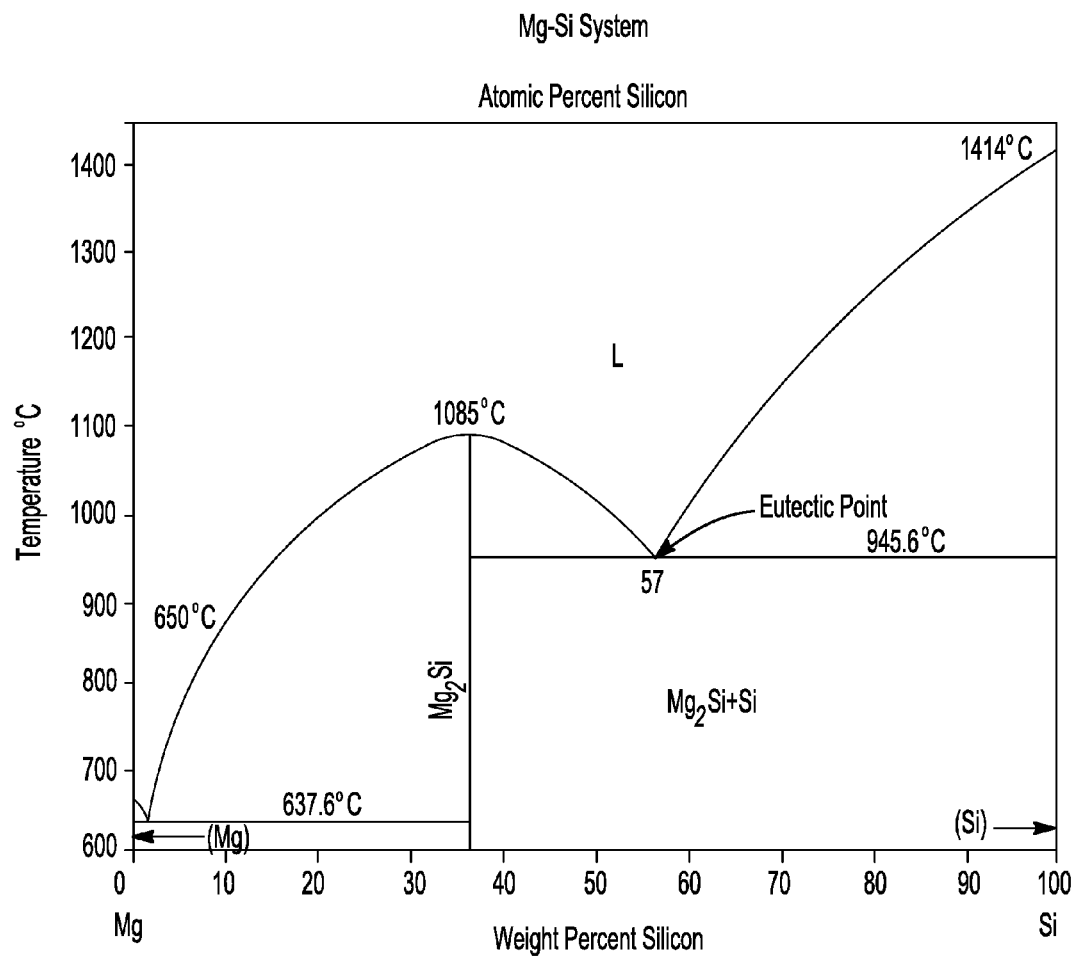

FIG. 7. A binary magnesium-silicon phase diagram is shown. A eutectic occurs at 57 weight % silicon. The phase field below this eutectic point is the combination of magnesium silicide and silicon. Magnesium is negligibly soluble, less than or equal to about 1 ppm, in silicon. Lamellar morphology is expected for mixtures of magnesium and silicon solidified near the eutectic point. The lamellar spacing between the magnesium silicide and silicon is controlled by the cooling rate. Faster cooling rate results in smaller lamellar spacing.

FIG. 8. (a) An induction furnace capable of achieving temperatures greater than or equal to about 1600° C. The external insulation is composed of alumina sheets wrapped around the quartz tube. The boron nitride coated graphite crucible sits inside an alumina outer shell to provide further heat insulation. A feed-through for a high temperature thermocouple is provided at the top of the aluminum cap. (b) The induction furnace heating a mixture of magnesium and silicon. The crucible glows at temperatures above 1000° C. (c) The finished product consisting of a magnesium silicide-silicon composite with lamellar morphology. (d) Scanning electron micrograph on the $Mg_2Si$—Si composite in (c) with lamellar morphology grown by directional solidification.

FIG. 9. (a) Scanning electron micrograph (SEM) of a magnesium silicide-silicon composite with lamellar morphology (FIG. 8C) grown in the induction furnace in FIG. 8A. Scale bar is 10 µm. (b) and (c) Energy dispersive x-ray spectroscopy (EDX) on the same sample. The lighter color in (b) indicates the presence of magnesium, while the lighter color in (c) indicates silicon. (b) and (c) are nearly the inverse of each other indicating lamellar morphology. (d) Plot of the x-ray diffraction pattern on the magnesium silicide-silicon composite. All peaks indicate the presence of silicon and magnesium silicide.

FIG. 10. (a) The binary phase diagram for an iron-silicon system. There is a eutectoid at 54.4 weight % silicon. The phase field below the eutectoid is $\beta$-$FeSi_2$+Si. Above the eutectoid is a congruent phase transition from $\beta$-$FeSi_2$ to liquid. (b) An alternative plot of the Fe—Si phase diagram.

FIG. 11. EBIC measurements were performed to ascertain the electron diffusion length. (a) The short circuit current as a function of distance from the Schottky barrier formed by the tungsten probe and the ultra-high purity silicon surface is shown (solid white line). A single exponential fit to the current decay yields a diffusion length of ~500 µm for the clean silicon sample (dashed line). (b) A single exponential fit to the current decay for a sample contaminated with copper yields a diffusion length of ~300 nm (dashed line). (c) SIMS data on a magnesium silicide-silicon composite indicates the presence of chromium impurities.

FIG. 12. (a) A solar cell attached to a gold plated chip carrier which is housed inside of its socket. The socket has a lid with a 0.7 cm×0.7 cm opening to allow light through. (b) A solar simulator with a light intensity of 1 sun and an AM 1.5 filter illuminating the solar cell in (a). The solar cell is connected through electrical cables to a KEITHLEY 2400 source meter that allows for I-V measurements.

Figure 13:
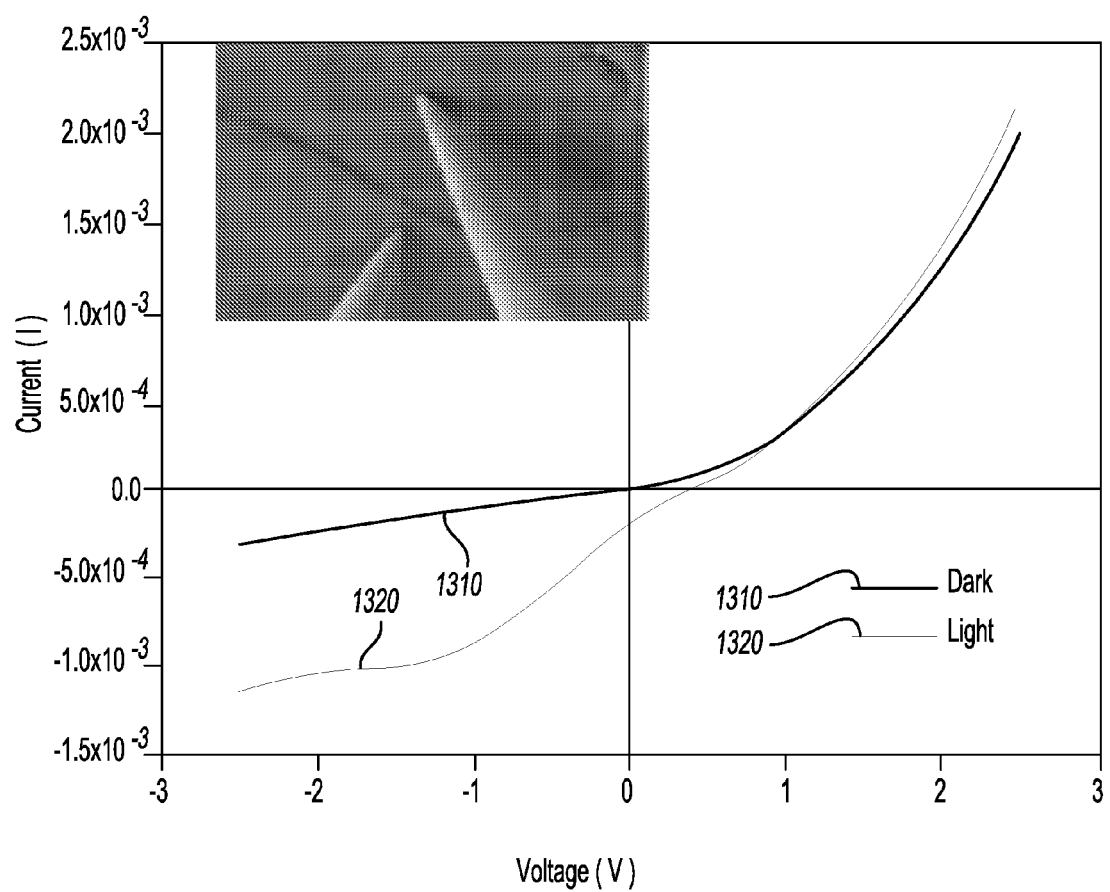

FIG. 13. Current-Voltage data on a lamellar eutectic heterojunction composite of $Mg_2Si$ and Si that is sliced into a wafer from the ingot in FIG. 8. The data is obtained by placing tungsten probe tips onto two adjacent $Mg_2Si$ and Si phases (inset). The measurements are carried out in the dark (1310) and under a lamp (1320). The data indicate a photovoltaic effect.

DETAILED DESCRIPTION

The following description of technology is merely exemplary in nature of the subject matter, manufacture and use of one or more inventions, and is not intended to limit the scope, application, or uses of any specific invention claimed in this application or in such other applications as may be filed claiming priority to this application, or patents issuing therefrom.

The headings (such as "Introduction" and "Summary") and sub-headings used herein are intended only for general organization of topics within the present disclosure, and are not intended to limit the disclosure of the technology or any aspect thereof. In particular, subject matter disclosed in the "Introduction" may include novel technology and may not constitute a recitation of prior art. Subject matter disclosed in the "Summary" is not an exhaustive or complete disclosure of the entire scope of the technology or any embodiments thereof. Classification or discussion of a material within a section of this specification as having a particular utility is made for convenience, and no inference should be drawn that the material must necessarily or solely function in accordance with its classification herein when it is used in any given composition.

The description and specific examples, while indicating embodiments of the technology, are intended for purposes of illustration only and are not intended to limit the scope of the technology. Moreover, recitation of multiple embodiments having stated features is not intended to exclude other embodiments having additional features, or other embodiments incorporating different combinations of the stated features. Specific examples are provided for illustrative purposes of how to make and use the compositions and methods of this technology and, unless explicitly stated otherwise, are not intended to be a representation that given embodiments of this technology have, or have not, been made or tested.

Example embodiments are thus provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. Equivalent changes, modifications and variations of some embodiments, materials, compositions and methods can be made within the scope of the present technology, with substantially similar results.

As used herein, the words "preferred," "desire" or "desirable" refer to embodiments of the technology that afford certain benefits, under certain circumstances. However, other embodiments may also be desirable, under the same or other circumstances. Furthermore, the recitation of one or more desired embodiments does not imply that other embodiments are not useful, and is not intended to exclude other embodiments from the scope of the technology.

As used herein, the word "include," and its variants, is intended to be non-limiting, such that recitation of items in a list is not to the exclusion of other like items that may also be useful in the materials, compositions, devices, and methods of this technology. Similarly, the terms "can" and "may" and their variants are intended to be non-limiting, such that recitation that an embodiment can or may comprise certain elements or features does not exclude other embodiments of the present technology that do not contain those elements or features.

Although the open-ended term "comprising," as a synonym of non-restrictive terms such as including, containing, or having, is used herein to describe and claim embodiments of the present technology, embodiments may alternatively be described using more limiting terms such as "consisting of" or "consisting essentially of." Thus, for any given embodiment reciting materials, components or process steps, the present technology also specifically includes embodiments consisting of, or consisting essentially of, such materials, components or processes excluding additional materials, components or processes (for consisting of) and excluding additional materials, components or processes affecting the significant properties of the embodiment (for consisting essentially of), even though such additional materials, components or processes are not explicitly recited in this application. For example, recitation of a composition or process reciting elements A, B and C specifically envisions embodiments consisting of, and consisting essentially of, A, B and C, excluding an element D that may be recited in the art, even though element D is not explicitly described as being excluded herein.

As referred to herein, all compositional percentages are by weight of the total composition, unless otherwise specified. Disclosures of ranges are, unless specified otherwise, inclusive of endpoints and include all distinct values and further divided ranges within the entire range. Thus, for example, a range of "from A to B" or "from about A to about B" is inclusive of A and of B. Disclosure of values and ranges of values for specific parameters (such as temperatures, molecular weights, weight percentages, etc.) are not exclusive of other values and ranges of values useful herein. It is envisioned that two or more specific exemplified values for a given parameter may define endpoints for a range of values that may be claimed for the parameter. For example, if Parameter X is exemplified herein to have value A and also exemplified to have value Z, it is envisioned that Parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if Parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

"A" and "an" as used herein indicate "at least one" of the item is present; a plurality of such items may be present, when possible. "About" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters.

When an element or layer is referred to as being "on," "engaged to," "connected to" or "coupled to" another element or layer, it may be directly on, engaged, connected or coupled to the other element or layer, or intervening elements or layers may be present. In contrast, when an element is referred to as being "directly on," "directly engaged to," "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The present technology relates to the growth and characterization of low cost, and high efficiency micro- and nanostructured p-n heterojunction solar cells through eutectic solidification. Eutectic solidification promotes the self-assembly of lamellar or rod-like domains (each respective phase in the eutectic or near-eutectic composition forms a domain having one or more orthogonal extensions or projections) with a length on a scale from hundreds of nanometers to micrometers. Such materials are ideal for the efficient extraction of minority carriers in metallurgical-grade materials; e.g., relatively impure materials. To date, no known inorganic solar cells have been constructed with such a eutectic or near-eutectic composition having the desired lamellar architecture. This technology, therefore, is the first to determine the impact of eutectic composition on inorganic solar cell efficiency. Earth abundant metallurgical grade materials with eutectic or near-eutectic compositions consequently allow for the development of low-cost and high efficiency solar cells.

Therefore, in various aspects, a material is provided that comprises a eutectic or near-eutectic composition having a first phase comprising silicon (Si) and a second phase comprising a metal silicide. Together, the first phase and the second phase are organized during cooling so as to define a lamellar architecture in the material. Such a lamellar architecture is shown in FIG. 3B (to be discussed in more detail herein), but can be generally understood to have respective phases defining parallel and planar body regions that are spaced apart from one another. From each respective planar body region extends one or more protrusions in a direction towards the planar region of the other phase. In various aspects, the protrusions can optionally have an orthogonal orientation to the plane defined by each phase (in other words, the protrusions are rods or lamellae that are perpendicular to or extend in a "z-axis" direction to the major "x and y-axes" directions defined by the planar body region). Thus, a plurality of protrusions from each respective phase is interleaved with those of the other phase during formation, so as to create an interdigitated or lamellar architecture between the first and second phases. As discussed in more detail below, such a lamellar architecture is particularly advantageous for use in a photovoltaic or solar cell, in that it defines a lamellar heterojunction between the first and second phases that can serve as an n-type and p-type material, respectively. The lamellar heterojunction from the lamellar architecture thus provides a solar cell having high efficiency and superior photovoltaic performance, while desirably enabling a lower cost manufacturing process.

In certain aspects, the present disclosure provides methods for making such materials. In one variation, such a method of making a material having a lamellar architecture comprises heating a mixture comprising a first material comprising silicon (Si) and a second material comprising a metal to a temperature that is greater than or equal to a eutectic point temperature or a eutectoid point temperature corresponding to the mixture, so as to melt the metal. The mixture comprises silicon and metal in amounts of a eutectic composition or a near-eutectic composition. As used herein, the term "eutectic or near-eutectic" means that a composition that comprises silicon and the select metal (or semi-metal or plurality of metals or semi-metals) at levels that are capable of transitioning through a cooling process through the eutectic point temperature for the system (where a liquid transitions to two distinct solid phases through or near (within approximately 10%, preferably within approximately 5%, and preferably within approximately 3%) a eutectic point or alternatively by transitioning through cooling through the eutectoid point temperature for the system where a solid transitions into two distinct solid phases through or near (within approximately 10%, preferably within approximately 5%, and preferably within approximately 3%) a eutectoid point).

Thus, in accordance with such methods, the mixture is cooled to form a eutectic or near-eutectic solid composition comprising a first phase comprising silicon and a second phase comprising a metal silicide. The rate of cooling can be controlled so as to form the desired lamellar architecture, where the first phase and the second phase together define a lamellar architecture in the eutectic or near-eutectic composition. As used herein, the term "composition" refers broadly to a substance containing at least the preferred chemical compound or element, but which may also comprise additional substances or compounds, including impurities. The term "material" also broadly refers to matter containing the preferred compound or composition.

In various aspects, the present teachings provide a eutectic or near-eutectic composition from a material system that comprises silicon (Si) and a metal silicide. In certain aspects, a metal which can form a metal silicide is selected an element selected from Group 2 (alkaline earth metals), Groups 3-12 (transition metals), or Groups 13-15 (certain semi-metallic or metalloid elements) among others, of the IUPAC Periodic Table of Elements. In certain aspects, suitable metal elements that are known or believed to form silicides in a eutectic material system (also comprising silicon (Si)) are selected from the group consisting of: calcium (Ca), cadmium (Cd), cerium (Ce), cobalt (Co), chromium (Cr), iron (Fe), magnesium (Mg), molybdenum (Mo), manganese (Mn), sodium (Na), tin (Sn), zinc (Zn), zirconium (Zr), and combinations thereof. In certain preferred variations, the metal is an element selected from the group consisting of: magnesium (Mg) and iron (Fe).

Thus, in one aspect, a eutectic or near-eutectic composition for a material system that comprises silicon and a metal comprising magnesium forms a metal silicide that is magnesium silicide ($Mg_2Si$). Thus, a method of making a material having a lamellar architecture comprises heating a mixture comprising a first material comprising silicon (Si) and a second material comprising magnesium. A first material may optionally comprise silicon at greater than or equal to about 98% by weight of the first material; optionally greater than or equal to about 99% by weight; optionally greater than or equal to about 99.5% by weight silicon, optionally greater than or equal to about 99.95% by weight silicon. Such silicon materials having these impurity ranges are commercially available as metallurgical grade silicon. The mixture may also comprise a second material having magnesium present at greater than or equal to about 98% by weight of the second material; optionally greater than or equal to about 99% by weight; optionally greater than or equal to about 99.5% by weight magnesium, optionally greater than or equal to about 99.95% by weight magnesium. Thus, after mixing the first material comprising silicon and the second material comprising magnesium, the mixture is heated to a temperature above the eutectic point for a binary system of silicon and magnesium and then cooled in a controlled manner to form the desired lamellar architecture. The eutectic point temperature for the silicon and magnesium system is about 945.6° C.

Thus, in certain aspects, a eutectic or near-eutectic composition for a material system that comprises silicon combined with magnesium as the metal optionally comprises magnesium at greater than or equal to about 40 weight % to less than or equal to about 45 weight % of the total weight of the mixture and silicon at greater than or equal to about 55 weight % to less than or equal to about 60 weight % of the total weight of the mixture. In certain variations, a eutectic or near-eutectic composition comprises magnesium at greater than or equal to about 43 weight % to less than or equal to about 44 weight % of the total weight of the mixture and silicon at greater than or equal to about 56 weight % to less than or equal to about 57 weight % of the total weight of the mixture.

In another aspect, a eutectic or near-eutectic composition for a material system that comprises silicon and a metal comprising iron forms a metal silicide that is β-iron silicide ($Si-\beta-FeSi_2$). Thus, a method of making a material having a lamellar architecture comprises heating a mixture comprising a first material comprising silicon (Si) and a second material comprising iron. A first material optionally comprises silicon at greater than or equal to about 98% by weight of the first material; optionally greater than or equal to about 99% by weight; optionally greater than or equal to about 99.5% by weight silicon, optionally greater than or equal to about 99.95% by weight silicon. Such silicon materials having these impurity ranges are commercially available as metallurgical grade silicon. The mixture may also comprise a second material having iron present at greater than or equal to about 98% by weight of the second material; optionally greater than or equal to about 99% by weight; optionally greater than or equal to about 99.5% by weight iron, optionally greater than or equal to about 99.95% by weight iron. Thus, after mixing the first material comprising silicon and the second material comprising iron, the mixture is heated to a temperature above the eutectoid point for a binary system of silicon and iron (which can still be in a solid phase) and then cooled in a controlled manner to form the desired lamellar architecture. The eutectoid point temperature for the silicon and iron system is about 937° C. In certain variations, the mixture may be heated to well above the eutectoid point, so that is in a liquid or semi-liquid phase well exceeding the eutectoid point. Then, the mixture is cooled through the eutectoid point to form the desired eutectic composition having lamellar architecture.

Thus, in such variations, a eutectic or near-eutectic composition for a material system that comprises silicon and a metal comprising iron that forms a metal silicide that is β-iron silicide (Si-β-FeSi$_2$). Thus, in certain aspects, a eutectic or near-eutectic composition for a material system that comprises silicon and iron optionally comprises iron at greater than or equal to about 42 weight % to less than or equal to about 48 weight % of the total weight of the mixture and silicon at greater than or equal to about 52 weight % to less than or equal to about 58 weight % of the total weight of the mixture. In certain variations, the eutectic or near-eutectic composition comprises iron at greater than or equal to about 44 weight % to less than or equal to about 46 weight % of the total weight of the mixture and silicon at greater than or equal to about 54 weight % to less than or equal to about 56 weight % of the total weight of the mixture.

In certain aspects, where the eutectic or near-eutectic composition is used in a photovoltaic or other electronic device, the first phase comprising silicon can include one or more dopants to form an n-type material. The second phase comprising a metal silicide can likewise include one or more dopants to form a p-type material. The first phase and the second phase respectively comprise orthogonal domains that together define the lamellar architecture and form a lamellar heterojunction between the n-type material and the p-type material.

Accordingly, the present disclosure also provides methods for generating an electric current. Such a method may comprise illuminating a photovoltaic cell, where the photovoltaic cell comprises a material comprising a eutectic or a near-eutectic composition having a first doped n-type phase comprising silicon (Si) and a second p-type phase comprising a metal silicide. The first phase and the second phase together define a lamellar architecture in the material. The photovoltaic cell is coupled to an external electrical circuit.

Therefore, certain aspects of the present disclosure include: (1) controlled growth of bulk crystals of impure silicide-silicon heterojunctions with nanostructured eutectic composition inside of an induction furnace; (2) material characterization of these nanostructured crystals by x-ray diffraction, x-ray photoelectron spectroscopy, secondary ion mass spectroscopy, scanning electron microscopy, and transmission electron microscopy; (3) controlled electrical doping of these materials; (4) determination of the minority carrier diffusion length in these materials via electron beam induced current measurements; (5) developing these crystals into functional solar cells; (6) measurement of the solar cell efficiency to determine the effects of nanostructured eutectic composition; and (7) optimization of the lamellar spacing and interface between each heterojunction to maximize efficiency.

Eutectic solidification eliminates the costly chemical processes used to purify silicon feedstock, and allows for enhanced minority carrier collection. Eutectic solidification is applicable to a variety of binary phase alloys that include a metal and silicon. Any metal-silicon, binary phase alloy containing a eutectic point (or eutectoid point) will allow the development of such a solar cell. Such materials can provide solar cells operating at efficiencies greater than 15%, yet be low-cost at less than $1/W. In addition, eutectic solidification allows for the manufacture of bulk nanostructured crystals at a scale commensurate with current photovoltaic technology.

The present technology demonstrates the efficacy of utilizing earth abundant, metallurgical grade feedstock (silicon, magnesium, and iron), for the development of low-cost (less than $1/W) and high efficiency (greater than 15%) solar cells with eutectic composition.

Silicon Purification

Metallurgical-grade silicon (MGS) is the raw, unpurified starting material for all crystalline silicon solar cells. MGS is typically reduced from quartz in an arc-furnace. Its cost basis is approximately $1-10/kg, making it ten to one-hundred times less expensive than solar-grade silicon. MGS contains many metal impurities, such as Al, Fe, Ti, Cr, and the like. The impurities are typically not uniformly distributed and almost all are deep level traps. Consequently, most MGS sources tend to be intrinsically lightly p-type since many of the impurities compensate each other.

Past studies have shown the effects of individual metal impurities on the efficiency of silicon solar cells. All impurities studied degraded the efficiency by decreasing minority-carrier diffusion lengths. Zone refining or chemical leaching of impurities are some of the methods used to remove or getter these impurities. These techniques, however, either significantly increase the cost or are not effective in improving the efficiency of traditional planar p-n junction solar cells.

The present technology increases the efficiency of MGS solar cells by engineering a nanostructured lamellar architecture through eutectic solidification. Specifically, two distinct lamellar heterojunctions, comprising an n-type Mg$_2$Si-p-type Si and n-type FeSi$_2$-p-type Si, can be grown via directional solidification inside of an induction furnace. Generally, this technique is applicable to any metal-silicon binary phase alloy that contains a eutectic point.

Recent theoretical studies indicate that metallurgical grade solar cells with lamellar-like p-n junctions attain larger values of efficiency than their planar p-n junction counterparts. One study, for example, concluded that the efficiency of a silicon solar cell with lamellar-like p-n junctions possessed an order of magnitude larger efficiency than its planar counterpart for impurity levels near $10^{18}$ impurity atoms/cm$^3$. The discussion below highlights the advantages of lamellar p-n junction architectures over planar p-n junctions for materials with large impurity and defect concentrations greater than or equal to about $10^{18}$ cm$^{-3}$.

Silicon Solar Cells with Planar p-n Junctions

Traditionally, silicon solar cells are fabricated by re-crystallization from a source of ultra-high purity silicon melt. FIG. 1 illustrates the various steps in a conventional process where SiO$_2$ is transformed to solar-grade silicon. The ensuing discussion of FIG. 1 also includes the associated cost for each step in U.S. dollars (which can fluctuate with the markets). Metallurgical grade silicon is approximately one hundred times less expensive than a purified silicon crystal. However, metallic impurities are well known to decrease the solar cell efficiency by increasing minority carrier recombination and thus high purity materials are required for electronic devices, like solar cells.

The ultra-high silicon is obtained from several distillation steps of metallurgical grade silicon (MGS) to form chlorosilanes, which are then reduced to silicon. Thus, in Step 1 of FIG. 1, sand comprising SiO$_2$ or other widely available silicon containing raw materials are processed in a coke reduction process in an arc furnace (or via other conventional reducing processes). A metallurgical grade silicon (MGS) is thus formed at Step 2 (which costs approximately $1.60/kg of Si). Then, in Step 3, the MGS treated with hydrochloric acid (HCl) forms a chlorosilane, which undergoes a first distillation process in Step 4, followed by a second distillation process in Step 5 to form High Purity $SiHCl_3$ (that costs approximately $18/kg) to remove various metallic impurities. The silicon purity after distillation is typically in a range of "eight to eleven nines" (99.999999% to 99.999999999%). In Step 5, the $SiHCl_3$ undergoes another reduction process with hydrogen ($H_2$) at 900° C. From this process, a polycrystalline silicon having a purity level measured in the parts per billion range is formed, which costs approximately $80/kg of Si. In Step 6, this polycrystalline silicon is further heated (e.g., to temperatures of 1,500° C.) and treated with conventional techniques to facilitate formation of a single-crystal silicon (that costs approximately $370/kg of Si) in Step 7.

In various aspects, the present technology provides the ability to eliminate various purification steps (Steps 3-5) required in conventional processes to remove metallic impurities. The solar cells prepared in accordance with the present inventive technology maintain high efficiencies through lamellar p-n heterojunctions grown via eutectic solidification, as will be discussed in greater detail below.

For purposes of comparison, the resultant single-crystalline silicon wafers formed via conventional processing techniques are capable of being used in various electronic devices are discussed herein. Such single-crystalline silicon wafers typically have a bulk impurity and defect concentration below $10^{14}$ cm$^{-3}$, when formed by conventional formation techniques as shown in FIG. 1 for example. A typical cell 10 comprises a low doped p-type silicon wafer 20 with carrier concentrations between $10^{15}$ and $10^{16}$ cm$^{-3}$. The backside 22 is heavily doped (greater than or equal to about $10^{18}$ cm$^{-3}$) p$^+$ with aluminum to form a metallic ohmic contact 24 and to act as a back surface field reflector to minimize electron recombination. A top layer 30 of n$^+$-type silicon is fabricated through diffusion doping or ion implantation of phosphorus. An electrically conductive grating of metal contacts 32 are formed above top layer 30. As a result, a planar p-n junction 50 is formed and is responsible for the separation of electron-hole pairs (FIG. 2A, where electrons are shown as black dots and holes as white dots).

Figure 2B:
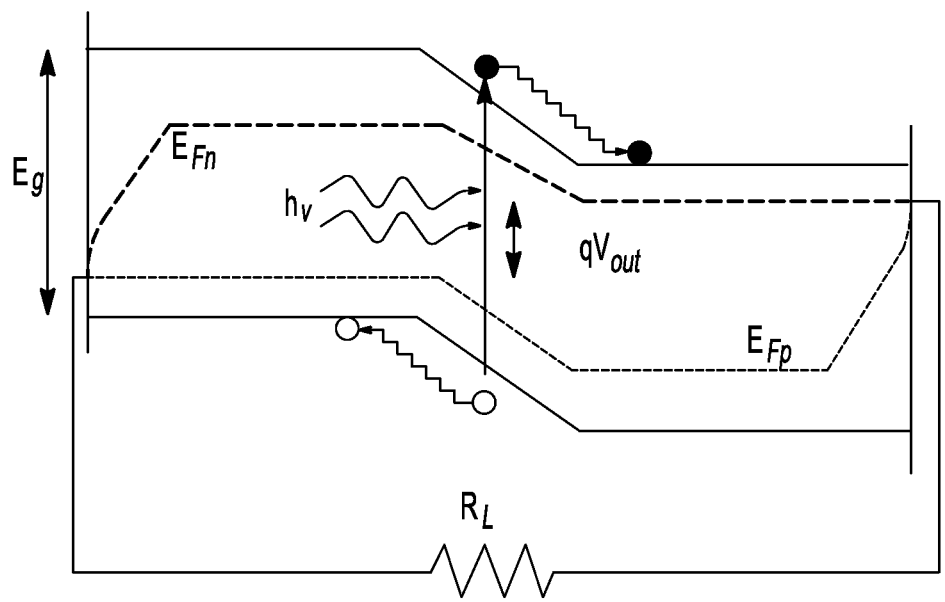

Incident photons with energies larger than the bandgap energy, $E_g$, are absorbed within the p-n junction and excite electrons into the conduction band which leave empty states or holes in the valence band. The process can be described by the following "reaction": $\gamma \rightarrow e^- + h^+$, where $\gamma$ represents a photon of energy$\geq E_g$ and $e^- + h^+$ are the electron and hole, respectively. The photons create a quasi-electrochemical potential difference across the p-n junction which drives the diffusion of the electron hole pairs in opposite directions (FIG. 2B).

Photo-generated electron-hole pairs generated outside of the p-n junction can still be collected and separated as long as they are within a diffusion length away from the junction. This is because the diffusion length sets the average distance an electron-hole pair may travel before the reverse reaction, $e^- + h^+ \rightarrow \gamma$, occurs in a process called recombination. Recombination can also lead to the generation of phonons (the dominant pathway in indirect bandgap materials such as silicon), but the effect is still the same. Recombination results in a loss of the electron-hole pair and thus no current production.

If the electron-hole pairs are close to the p-n junction (within a diffusion length) they may separate once they reach the junction and recombination no longer occurs. Each carrier then contributes to the current. The diffusion length for photo-generated carriers in ultra-high purity silicon can be as large as millimeters. This is also partly because the reaction $e^- + h^+ \rightarrow \gamma$ is somewhat inhibited because silicon is an indirect band-gap material. However, the indirect band-gap makes silicon's absorption coefficient small, which in turn requires silicon solar cells to be "optically" thick, on the order of hundreds of microns, so as to absorb most of the incident solar photon flux.

The large diffusion lengths required for such a thick cell are obtained by using ultra-high purity silicon, because defects and impurities can trap the photo-generated carriers and significant decrease their diffusion lengths. As discussed above however, conventionally, the requirement of high-purity silicon is associated with the high cost of silicon solar cells. In accordance with certain principles of the present disclosure; however, the purity requirements can be relaxed by changing a cell architecture to a lamellar p-n junction. This desirably results in a decrease of the cost for producing silicon solar cells since metallurgical-grade materials can be used.

Lamellar p-n Junction Architecture

Figure 3A:
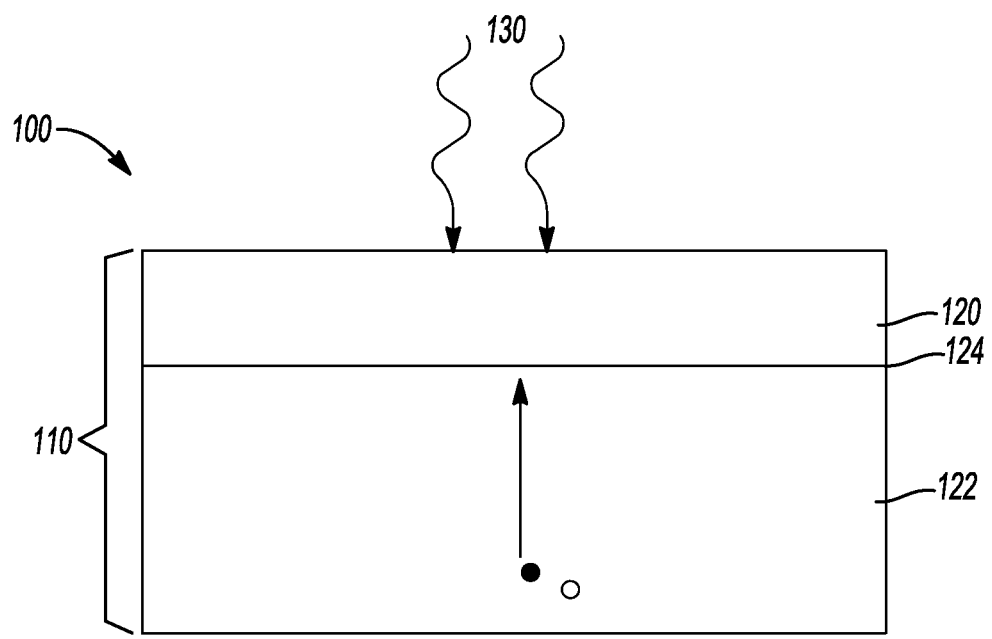
Figure 3B:
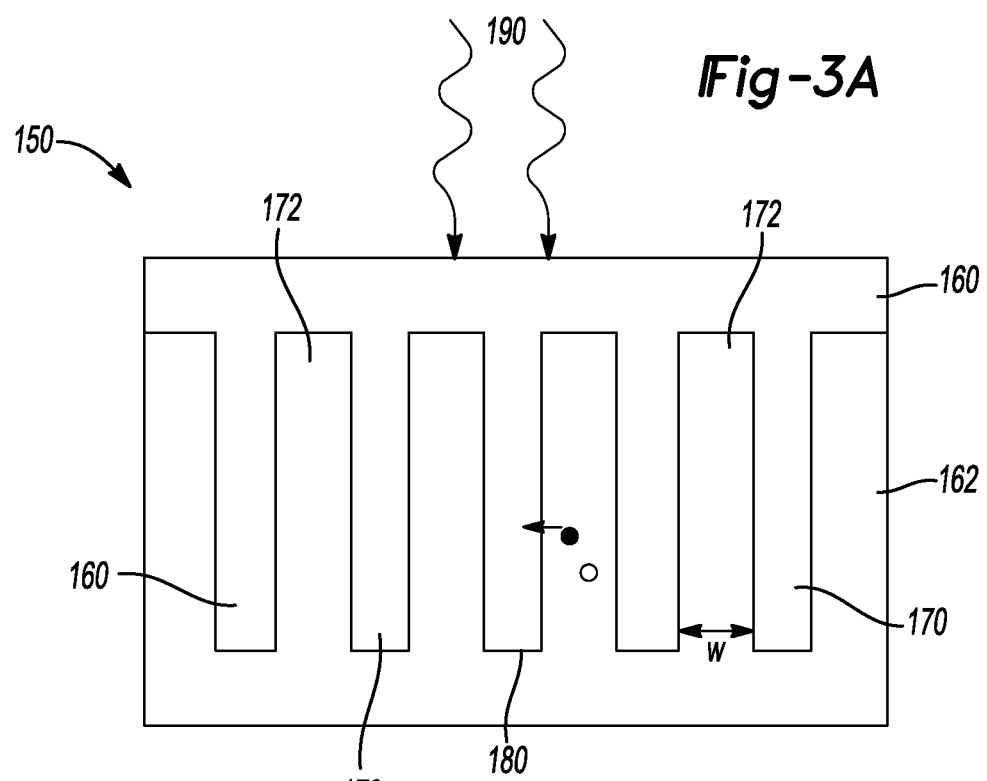

In a conventional planar p-n junction solar cell 100, such as that shown in FIG. 3A (or as previously discussed and shown in FIG. 2A), light absorption is in the same direction as carrier collection. The solar cell 100 shows the active material layers 110 of the solar cell 100, which comprises a doped n-type material layer 120 and a doped p-type material layer 122. A planar heterojunction 124 is formed between the doped n-type material layer 120 and the doped p-type material layer 122. Electrons are shown in black and holes in white in the doped p-type material layer 122. Light 130 enters into the n-type material layer 120. Only electron-hole pairs within a diffusion length of the junction are collected (FIG. 3A). Therefore, keeping diffusion lengths large (hundreds of microns) necessitates the use of high purity silicon materials so that trap densities are low and transmission remains high.

Interdigitated or lamellar p-n junction geometries, such as that shown in FIG. 3B on the other hand, relax the purity constraints placed on planar p-n junctions. In FIG. 3B, a solar cell 150 prepared in accordance with certain aspects of the present teachings is shown. The solar cell 150 comprises a doped n-type material 160 and a doped p-type material 162. The doped n-type material 160 has a plurality of rod-like extensions or lamellae 170 that extend into the doped p-type material 162. The doped p-type material 162 has a plurality of rod-like extensions or lamellae 172 that likewise extend into the doped n-type material 160, thus forming an interleaved or interdigitated lamellar morphology between the doped n-type material 160 and doped p-type material 162. Notably, a period "W" is shown in FIG. 3B that shows a distance from a select lamellae 170 to an adjacent lamellae 170 of doped n-type material 160 (or alternatively showing a distance of width for lamellae 172 of the doped p-type material 162).

A heterojunction 180 likewise follows the interleaved lamellar projections of the materials. Light 190 enters into the doped n-type material 160 and causes an electron pair to be formed (with an exemplary electron shown in black and a hole shown in white). Lamellar p-n junctions like 180 of solar cell 150 have theoretically been shown to enhance solar cell efficiencies in comparison to planar p-n junctions, when the trap density is high. Thus, the cost of producing a lamellar junction silicon solar cell in accordance with certain aspects of the present teachings is lower than that of a planar junction cell since metallurgical grade silicon feedstock can be used.

A key feature of lamellar p-n junctions, like 180 in FIG. 3B, is that carrier collection is orthogonal to light collection. This means that shorter collection distances (less than or equal to about 1 μm) are possible (see FIG. 3B with a black electron and white hole carrier). Therefore, as light is absorbed throughout the entire cell thickness, the carriers have a much shorter collection pathway to traverse before recombination can occur. The diffusion length:

$$L=\sqrt{\tau D}$$

where τ is the recombination lifetime and D is the diffusion constant, limits the lamellar spacing, W, between each junction. Ideally, the spacing should be equal or smaller than the diffusion length, W≤L. Therefore, for small diffusion lengths, L less than or equal to about 1 µm, which are typically found in metallurgical materials, nanostructured lamellae are desirable.

The recombination lifetime is inversely proportional to the trap density. In high-purity silicon wafers with a trap density $10^{15}$ cm$^{-3}$, τ is 100 µs, which corresponds to a diffusion length of 600 micrometers (µm). However, silicon with trap densities on the order of $10^{19}$ cm$^{-3}$ will have diffusion lengths of about 1 µm. In certain variations, the metallurgical-grade materials used in the present technology can be selected to have minority carrier diffusion lengths in the range of about 300 nm to about 10 µm.

Figure 4A:
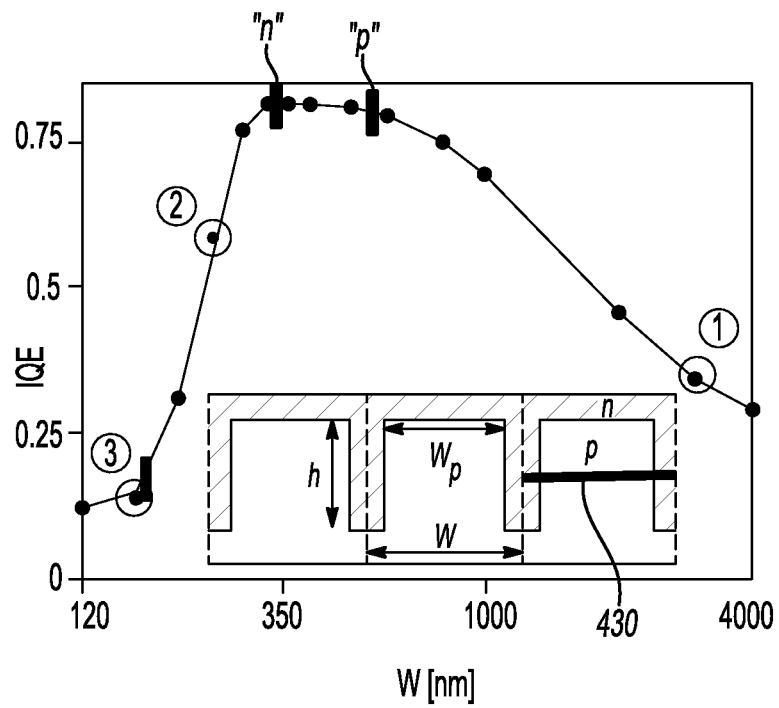
Figure 4B:
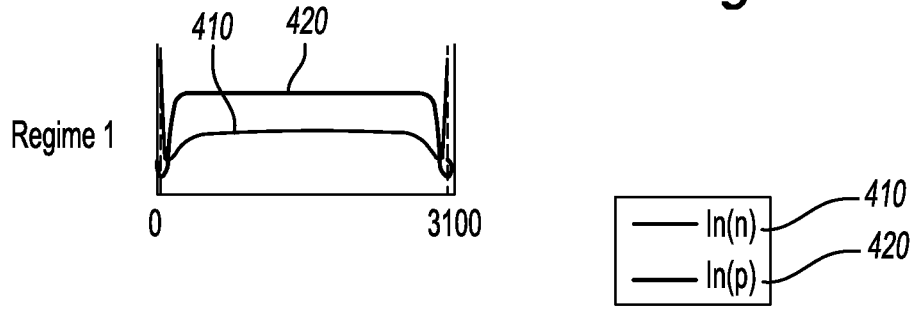
Figure 4B:
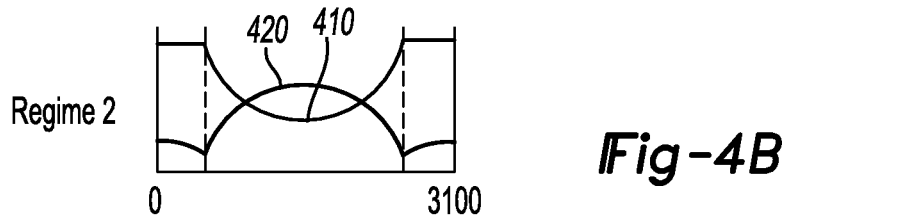
Figure 4B:
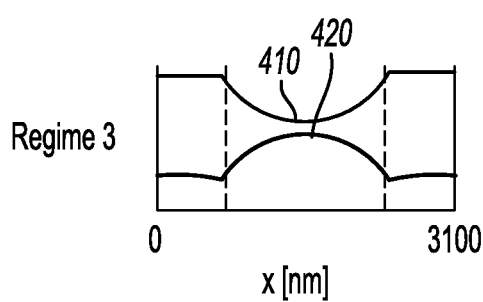

FIG. 4A shows a two-dimensional model of lamellar nanostructured p-n junctions. FIG. 4B shows a cross-section of a natural logarithm of carrier density for electrons (410) and holes (420) through one junction designated 430 for Regimes 1, 2, and 3 designated in FIG. 4A. As can be seen, a two-dimensional model of the lamellar heterojunctions in the material indicates that the internal quantum efficiency (IQE) of such architecture increases favorably as the pitch, W, decreases (FIG. 4A). In other words, the IQE increases favorably as the lamellar spacing between each heterojunction decreases. Such a two-dimensional model relies on solving drift-diffusion and Poisson-equations and assumes Shockley-Read-Hall recombination. Eventually, the IQE plateaus at a pitch of 350 nm and begins to steeply decrease. The decrease of IQE below 350 nm is a consequence of complete depletion of the p-n junction. Therefore, the decrease of IQE is a consequence of completely depleted materials, which gives rise to large increased recombination rates. Regime 3 signifies complete depletion of the majority carriers. This fact is one reason why nanowire solar cells at length scales smaller than 100 nm do not exhibit large efficiencies.

Silicon-Silicide p-n Heterojunctions

In various aspects, a material suitable for use in photovoltaic or solar cell has a lamellar p-n junction geometry. In certain variations, such a lamellar p-n junction geometry is grown by a eutectic solidification process that produces silicon-silicide heterojunctions. As particular examples, two different silicon-silicide heterojunctions are characterized herein: silicon-magnesium silicide (Si—Mg$_2$Si) system and a silicon-β-iron silicide (Si-β-FeSi$_2$) system. Both magnesium silicide (Mg$_2$Si) and β-iron silicide (β-FeSi$_2$) are semiconductors with an indirect bandgap of 0.75 eV and a direct bandgap of 0.9 eV, respectively. Magnesium silicide can crystallize in the antifluorite structure, while β-iron silicide is orthorhombic. The absorption coefficients of magnesium silicide and β-iron silicide, α, are more than two orders of magnitude larger, α>$10^3$ cm$^{-1}$ at 1.0 eV, than silicon.

A band diagram of an n-type Mg$_2$Si-p-type Si heterojunction is shown in FIG. 5. Band bending at the interface between both materials indicates that charge separation is possible. The band diagram of a magnesium silicide-silicon or β-iron silicide-silicon heterojunction yields band bending at the junction that is ideal for charge separation of electron-hole pairs (FIG. 5). Charge separation is a key aspect of operation of a solar cell. The band diagram is very similar to that of CIGS-CdS heterojunction solar cells, which routinely achieve efficiencies greater than 15%. Similar band bending is expected for a β-FeSi$_2$—Si heterojunction. In addition, only one type of dopant atom, aluminum, can be employed to simultaneously dope silicon p-type and magnesium silicide n-type. Iron silicide is doped p-type by Al, so in a β-iron silicide-silicon system, phosphorus would be employed as well. Aluminum impurities or other dopants can readily and easily be integrated into the feedstock melt during eutectic solidification in accordance with certain principles of the present disclosure.

Dislocations at a p-n junction are known to act as trap states by increasing recombination rates by tunneling via trap states. In certain variations, the interface between the silicides and silicon will contain dislocations due to lattice mismatch. The lattice mismatch between magnesium silicide and silicon depends on the crystal orientation. Previous studies have shown lattice mismatches as low as 2% for <100> magnesium silicide on <100> silicon. The lattice mismatch between β-iron silicide and silicon can be small for various crystal orientations and epitaxy can be achieved on a (100) silicon wafer. Nevertheless, dislocation densities can be characterized via scanning electron microscopy. Indeed, CIGS-CdS heterojunction solar cells have large defect densities that arise from the mismatch between the wurtzite crystal structure of CdS and the chalcopyrite structure of CIGS, yet achieve large solar cell efficiencies greater than or equal to about 15%.

In experiments, current-voltage (I-V) measurements on a planar n-type magnesium silicide, p-type silicon solar cell are performed. The device having the desired junction is fabricated by depositing 500 nm of n-type magnesium silicide (Mg$_2$Si) via electron beam deposition onto a p-type (1-10 Ω·cm) silicon wafer. The backside of the silicon wafer is doped heavily, p$^+$ greater than or equal to about $10^{19}$ boron atoms/cm$^3$, to form an ohmic contact to the rear aluminum metal.

Figure 6A:
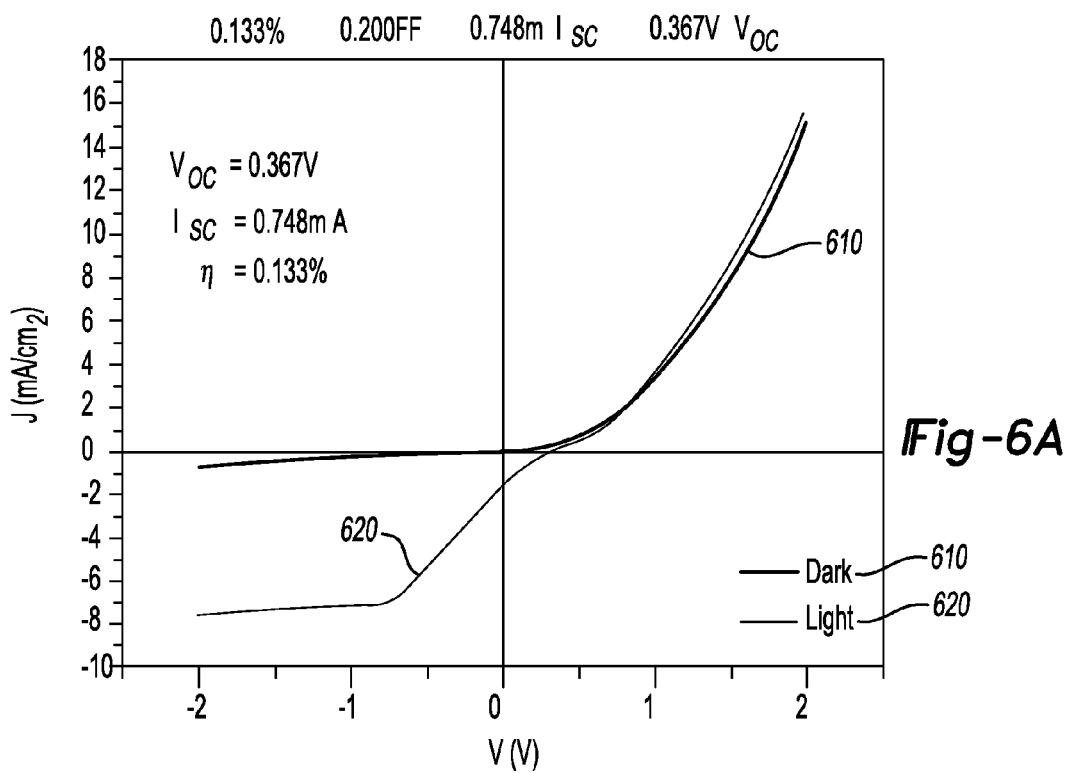

FIG. 6A shows the I-V characteristics of a representative cell (a planar n-type Mg$_2$Si-p-type Si heterojunction) in the dark (610) and under 1 sun, AM 1.5 illumination (620). The device exhibits a photovoltaic effect under illumination with an open-circuit voltage of 0.45V. The open circuit voltage is quite large, 0.4 V, while the short circuit current is small. The small short circuit current is believed to be due to the amorphous nature of the magnesium silicide film. The short circuit current can be greater than or equal to about 10 mA/cm$^2$ for optimized crystalline samples. In addition, the fill factor can be significantly improved for crystalline devices with optimized front side contacts and surface passivation layers.

Figure 6B:
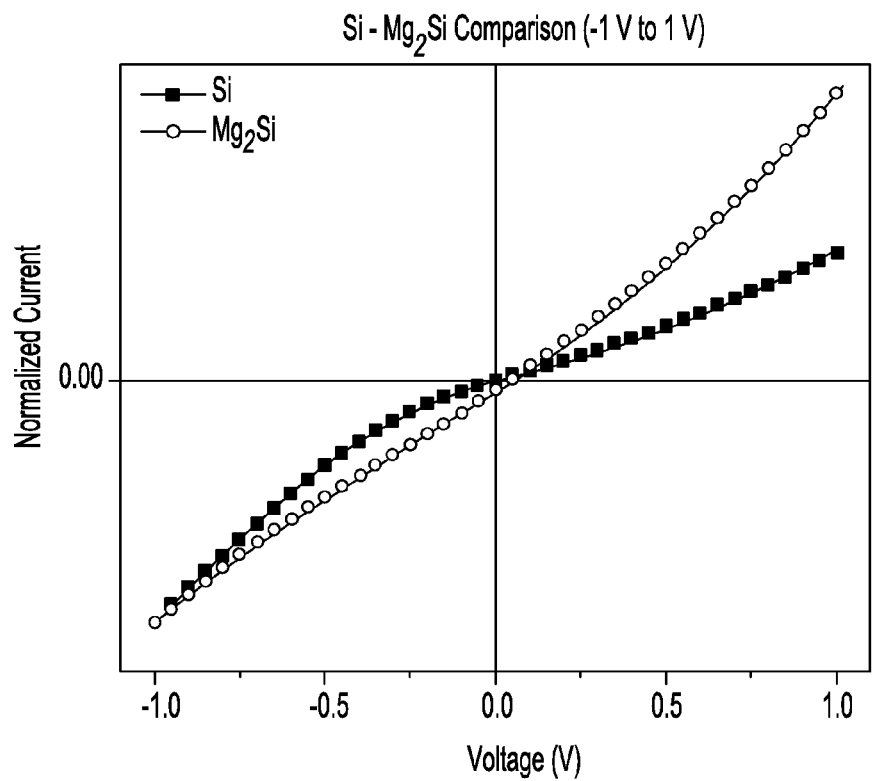

Control experiments to rule out photovoltaic effects from unintended Schottky barriers between the semiconductors (Mg$_2$Si and Si) and the metal contacts are performed and do not show any photovoltaic effect (FIG. 6B). Thus, in FIG. 6B I-V control experiments are conducted to determine if the photovoltaic effect in the device tested in FIG. 6A truly arises from the heterojunction or is an artifact of a Schottky contact between the semiconductors with the metal rear contact or wire bonding. The control experiments show nearly ohmic behavior and no photovoltaic effect is observed indicating that the heterojunction is responsible for the charge separation. Therefore, it can be assumed that the measured photovoltaic response in FIG. 6A originates from the magnesium silicide-silicon heterojunction. In accordance with the present disclosure, FIG. 6A is believed to represent the first time a photovoltaic effect has been measured from a magnesium silicide-silicon heterojunction.

Figure 6C:
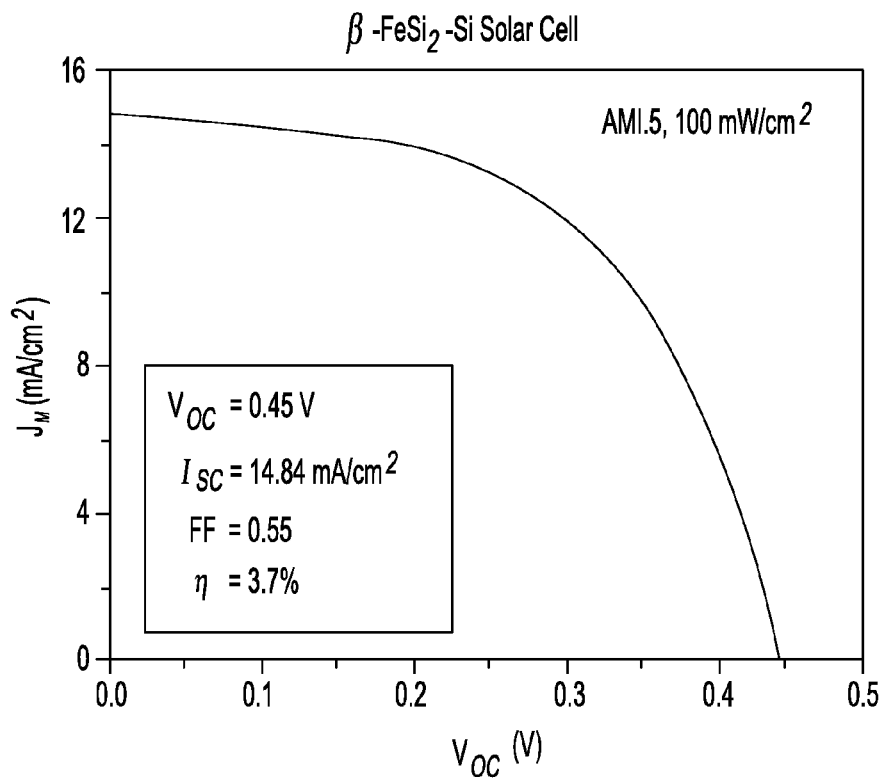

FIG. 6C shows I-V measurements obtained from Liu, et al., "A thin-film solar cell of high-quality β-FeSi$_2$/Si heterojunction prepared by sputtering." *Solar Energy Materials and*

Solar Cells 90 (3), 276 (2006), the relevant portions of which are incorporated herein by reference, on a planar n-type β-FeSi$_2$-p-type Si solar cell and demonstrates that such a planar heterojunction exhibits a photovoltaic effect as well. Here, the single crystal β-iron silicide is deposited onto <111> silicon substrate by molecular beam epitaxy. The crystalline nature of the device is believed to be the reason why the current is much larger than the magnesium silicide-silicon device. The planar β-iron silicide-silicon solar cell achieved efficiency values greater than 3% under 1 sun and AM 1.5 illumination. As discussed further herein, lamellar silicon-silicide heterojunctions prepared in accordance with certain aspects of the present technology, grown via eutectic solidification can achieve efficiencies greater than their planar counterparts.

Crystal Growth of Lamellar Heterojunctions via Eutectic Solidification

Eutectic solidification results in two solid phases that solidify cooperatively from the liquid melt, L→α+γ, where L denotes liquid and α and γ are the two distinct phases (β is not chosen as a symbol to eliminate confusion with β-iron silicide). The phases typically appear as alternating lamellae, or as rod-like structures of a minor phase embedded in a matrix of the other phase. The eutectic composition arises from the cooperative growth behind an essentially planar solidification front. As the A-rich α-phase crystallizes, excess B atoms diffuse laterally where they are integrated into the B-rich γ-phase.

The lamellar morphology is most common when the volumes of both phases are nearly equal (around 50%). The lamellar spacing between each phase can be controlled by the cooling rate. Fast cooling typically yields small spacing whereas slow cooling yields large lamellar spacing. The present technology can achieve a wide range of lamellar spacing (e.g., from about 300 nm to about 10 µm) by varying the cooling rate during directional solidification. The efficiency of the lamellar photovoltaic devices can be measured as a function of lamellar spacing. These experiments confirm the theoretical calculations performed in FIG. 4.

A binary phase diagram for the magnesium-silicon system is shown in FIG. 7. A distinct eutectic point occurs near 57 weight % silicon for the magnesium-silicon system. The phase field below the eutectic point comprises a combination of magnesium silicide (Mg$_2$Si) and silicon (Si). Magnesium is negligibly soluble (less than or equal to about 1 ppm) in silicon. Therefore, lamellar morphology is expected to result for mixtures of magnesium and silicon solidified at or near the eutectic point. The eutectic temperature for this eutectic composition is approximately 945.6° C. Lamellar spacing between the magnesium silicide and silicon can be controlled by controlling the cooling rate. As discussed above, faster cooling rate results in smaller lamellar spacing. Therefore, in accordance with certain aspects of the present teachings, melting a mixture comprising about 57 weight % silicon and 43 weight % magnesium creates an alloy of magnesium silicide and silicon having lamellar morphology. Experimental results discussed below indicate that such morphology is realized (FIGS. 8 and 9).

Figure 8A:
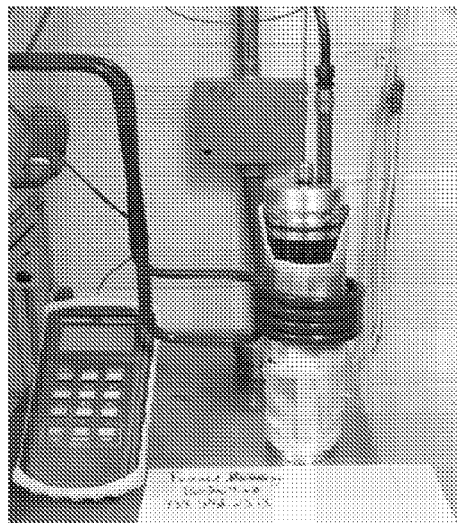
Figure 8B:
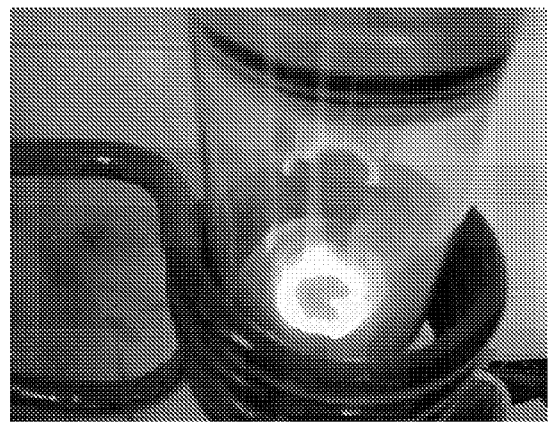

FIG. 8A shows an induction furnace capable of achieving temperatures of greater than or equal to about 1,600° C. for heating compositions comprising silicon and metal to form the desired lamellar morphology by eutectic solidification. External insulation is composed of alumina sheets wrapped around a quartz tube. The boron-nitride coated graphite crucible sits inside an alumina outer shell to provide further heat insulation. A feed-through for a high temperature thermocouple is provided at the top of the aluminum cap. FIG. 8B shows a detailed view of the induction furnace heating a material mixture comprising magnesium and silicon. The crucible glows at temperatures above approximately 1,000° C.

Figure 8C:
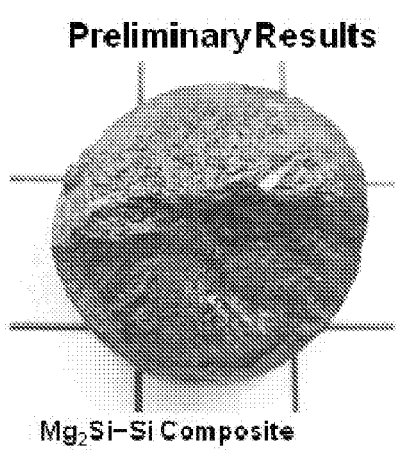
Figure 8D:
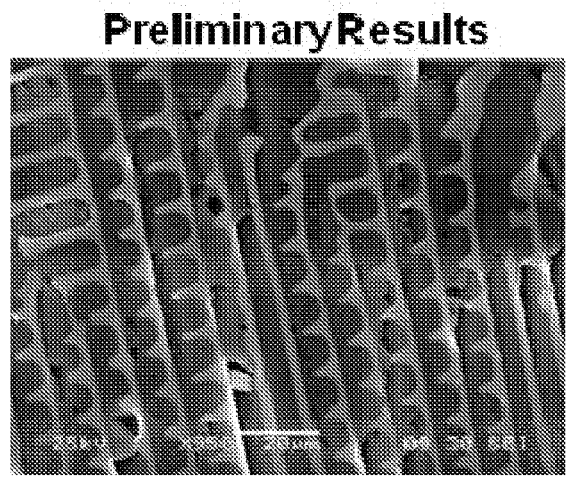

A pellet in FIG. 8C is grown by first mixing about 44 weight % metallurgical grade magnesium with about 56 weight % metallurgical grade silicon in the boron-nitride coated graphite crucible of FIGS. 8A-8B. The 1% excess magnesium is employed because of the low melting point of magnesium, which causes some to evaporate during melting in the induction furnace. The mixture of magnesium and silicon is heated to temperatures of greater than or equal to about 1,000° C. for several minutes in the presence of an inert atmosphere of 99% argon and 1% SF$_6$, which completely melts the magnesium and dissolves the silicon. Then, the charge is cooled to room temperature and removed from the crucible. FIG. 8C shows a finished product comprising a magnesium silicide-silicon composite with lamellar morphology. FIG. 8D is a scanning electron micrograph on the Mg$_2$Si—Si composite in FIG. 8C with lamellar morphology grown by directional solidification.

Figure 9A:
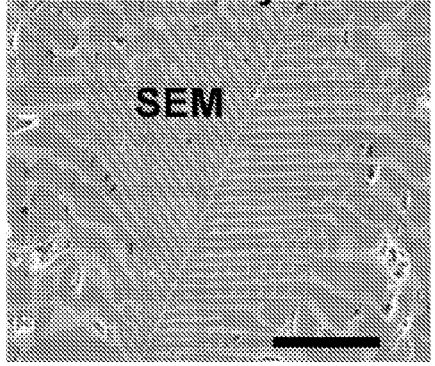
Figure 9B:
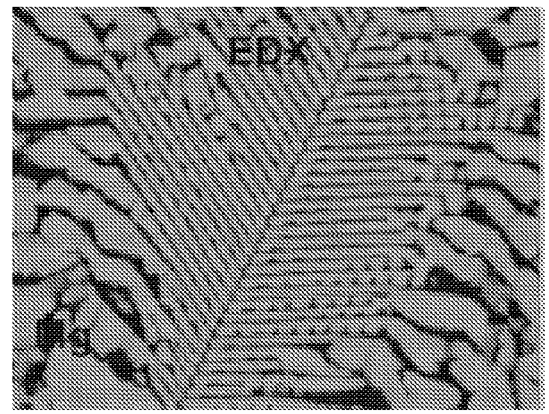
Figure 9C:
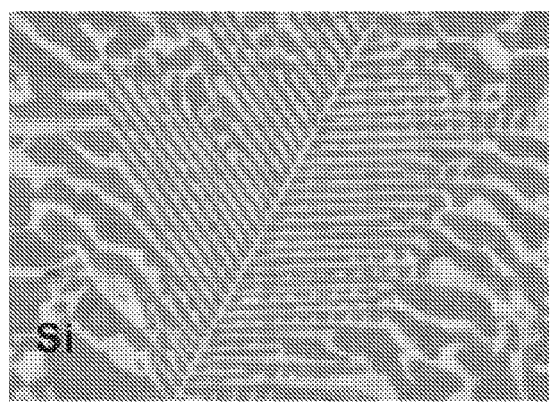
Figure 9D:
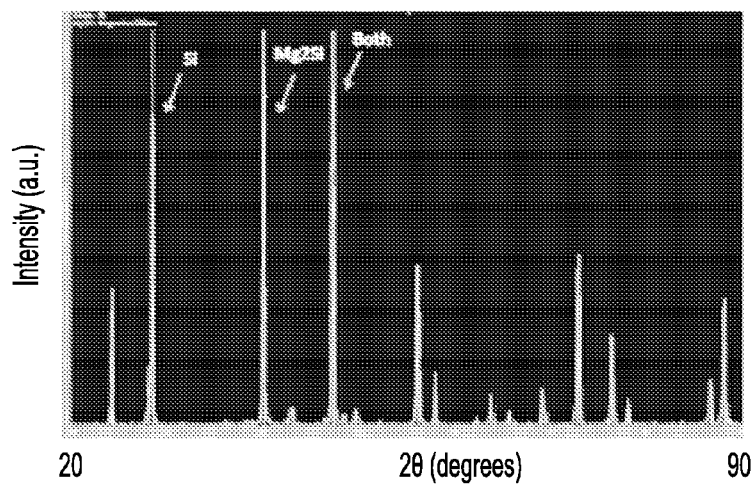

FIG. 9A is a scanning electron micrograph (SEM) of a magnesium silicide-silicon composite with lamellar morphology (as in FIG. 8C) grown in the induction furnace in FIG. 8A. FIGS. 9B-9C are energy dispersive x-ray spectroscopy (EDX) on the same sample. These energy dispersive x-ray spectroscopy along with x-ray diffraction measurements confirms the presence of magnesium silicide and silicon domains (FIGS. 9B, 9C, and 9D). The lighter color in FIG. 9B indicates the presence of magnesium, while the lighter color in FIG. 9C indicates silicon. FIGS. 9B and 9C are nearly the inverse of each other indicating lamellar morphology. FIG. 9D on the other hand is a plot of the x-ray diffraction pattern on the magnesium silicide-silicon composite. All peaks indicate the presence of silicon and magnesium silicide.

Figure 10A:
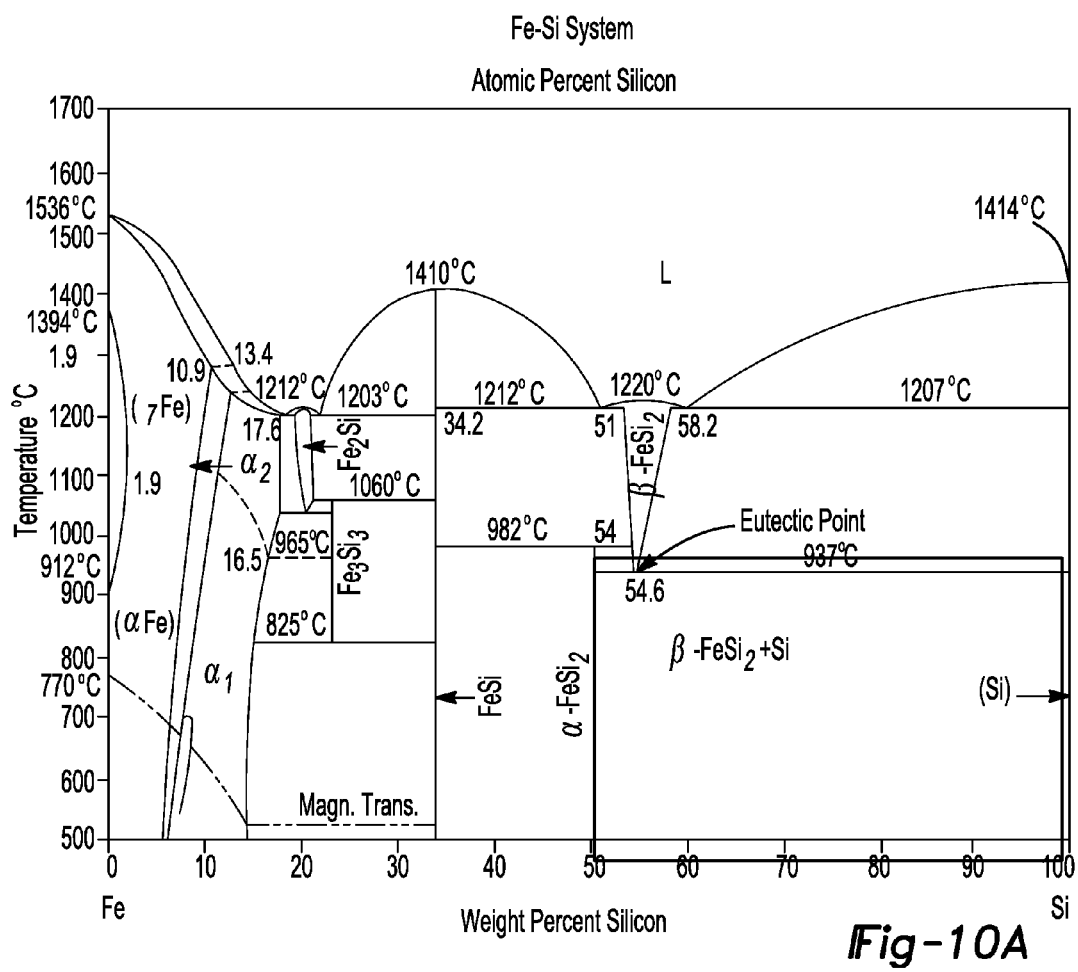
Figure 10B:
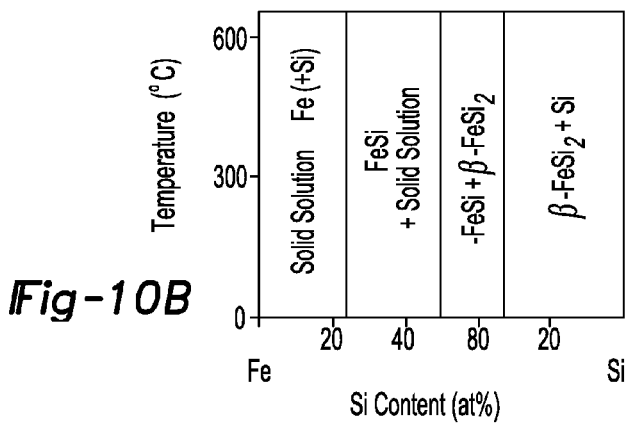

FIG. 10A shows a binary phase diagram for an iron-silicon system, while FIG. 10B shows another alternative plot of the Fe—Si phase diagram (in atomic percentages). The iron-silicon system is similar to the magnesium-silicon system, but with one major difference. The β-iron silicide-silicon composite is formed through a eutectoid rather than a eutectic point (FIG. 10). More specifically, the eutectoid is at about 54.4 weight % silicon (about 45.6 weight % iron). The phase field below the eutectoid is silicon-β-iron silicide (Si and β-FeSi$_2$, respectively). Above the eutectoid point is a congruent phase transition from β-FeSi$_2$ to liquid.

Measurement of Impurity Concentration and Diffusion Length

Electron Beam Induced Current (EBIC) Measurements

EBIC can be used to quantitatively measure the minority carrier diffusion length and to directly "image" non-radiative recombination regions in the metallurgical-grade silicon-silicide composites. In FIG. 11, EBIC measurements are performed to ascertain the electron diffusion length. These experiments can be carried out in a scanning electron microscope specially modified with two micromanipulator electrical probes and EBIC electronics at the National Institute of Standard and Technology (NIST). EBIC measurements can be carried out on silicon-silicide composites with different lamellar spacing, and the dependence of the EBIC current on lamellar spacing can be used to optimize the growth of the silicon-silicide solar cells.

Figure 11A:
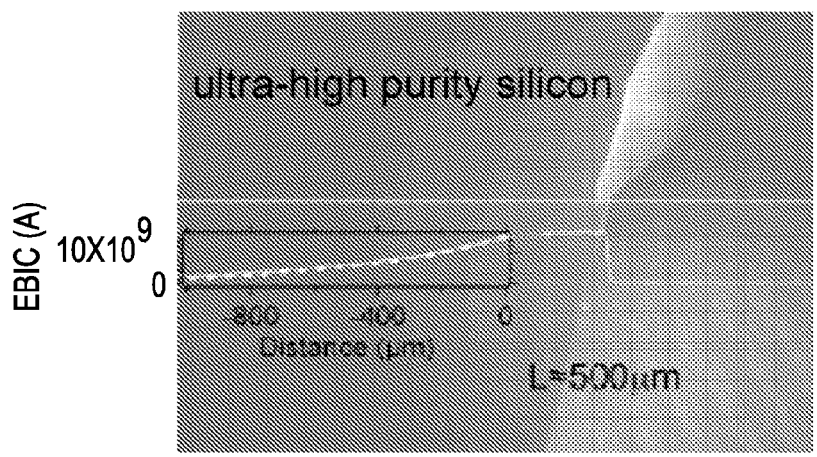

Measurements on an intentionally copper-contaminated silicon wafer and an ultrahigh purity silicon wafer demonstrate the efficacy of using EBIC measurements to determine the minority carrier diffusion length. The samples used for the EBIC measurements in FIG. 11 consisted of ultrahigh purity (FIG. 11A) and copper contaminated (FIG. 11B) silicon substrates. A tungsten probe tip inside the SEM makes contact with the top surface of the silicon substrate. A Schottky barrier is formed at the contact and this acts as the junction to separate charge. In FIG. 11A, a short circuit current as a function of distance from the Schottky barrier formed by the tungsten probe and the ultra-high purity silicon surface is shown (solid white line). A single exponential fit to the current decay yields a diffusion length of approximately 500 µm for the clean silicon sample (dashed line). This electron diffusion length of about 500 µm for the ultrahigh purity silicon substrates is consistent with published reports.

Figure 11B:
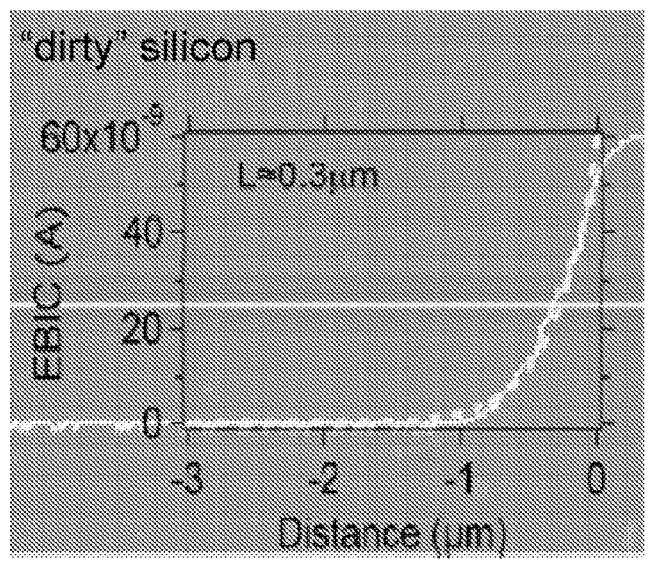

Thus, the short circuit current (EBIC current) profile (solid line) as a function of distance from the junction is fit to a single exponential decay function (dashed line, FIGS. 11A and 11B). In FIG. 11B, a single exponential fit to the current decay for a sample contaminated with copper yields a diffusion length of approximately 300 nm (dashed line).

Secondary Ion Mass Spectroscopy Measurements

Figure 11C:
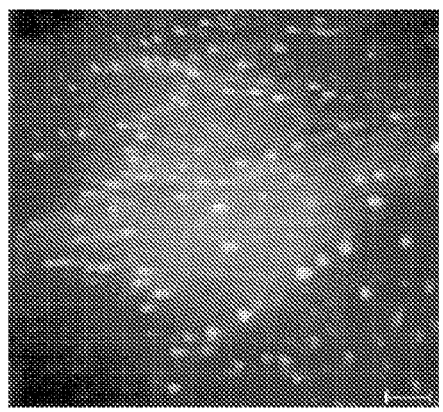

Secondary Ion Mass Spectroscopy (SIMS) can ascertain the impurity concentration in the as-cast silicon-silicide composites. These measurements can be used in conjunction with EBIC to determine the optimal lamellar spacing that maximizes solar cell efficiency. FIG. 11C shows SIMS data on a magnesium silicon-silicide composite. The bright dots indicate the presence of chromium impurities.

Photovoltaic Efficiency Measurements

Electrical Measurements in the Dark and Under 1 Sun, AM 1.5 Illumination

Electrical measurements in the dark and under illumination can be performed on the silicon-silicide composites. The composite pellets are sliced and polished into about 200 µm to about 500 µm thick wafers. The front side of the wafer can be etched with $XeF_2$ to selectively etch back the silicon. Then, silicon dioxide is coated onto the front surface with spin coating to electrically isolate the $Mg_2Si$ from the silicon. Similarly, on the back side, the $Mg_2Si$ is selectively etched with nitric acid and another layer of spin-on-glass is coated to electrically isolate the silicon. Diffusion doping of aluminum on the exposed front and back sides will dope the $Mg_2Si$ and silicon $n^+$ and $p^+$ respectively to form ohmic contacts to the metal electrodes.

The cross-sectional view of the completed device, cut longitudinally, appears like the schematic shown in FIG. 3B having the lamellar morphology. Metal electrodes are then deposited on each side of the wafer for electrical connection. Alternatively and generally, contacts can be built into the growth of the eutectic silicide-silicon heterojunctions by a continuous feed process whereby the composition of the feedstock is varied from metal rich in the beginning of the growth process to silicon rich near the end. In this manner, the completed eutectic composite appears as in FIG. 3B.

Figure 12A:
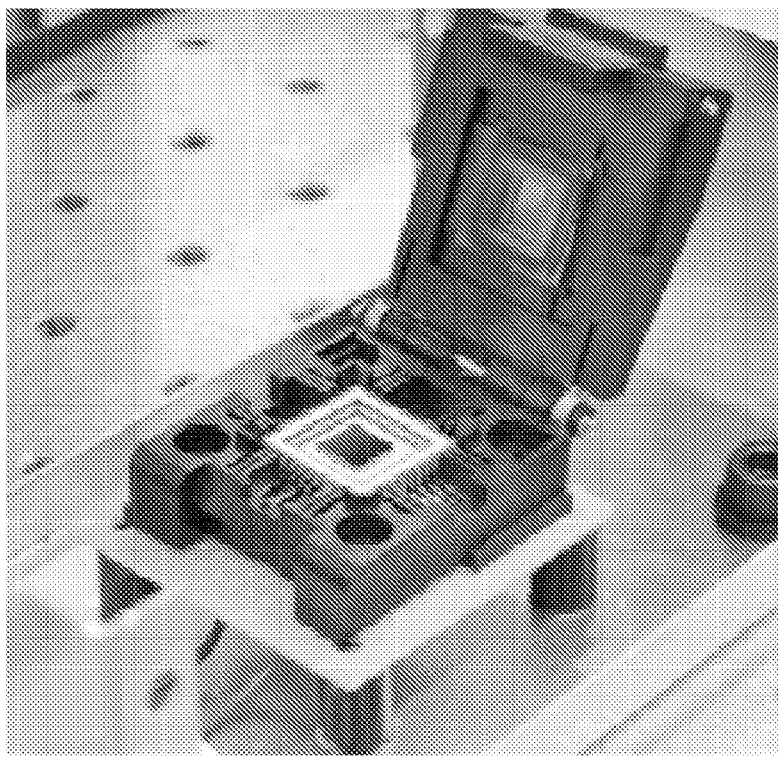
Figure 12B:
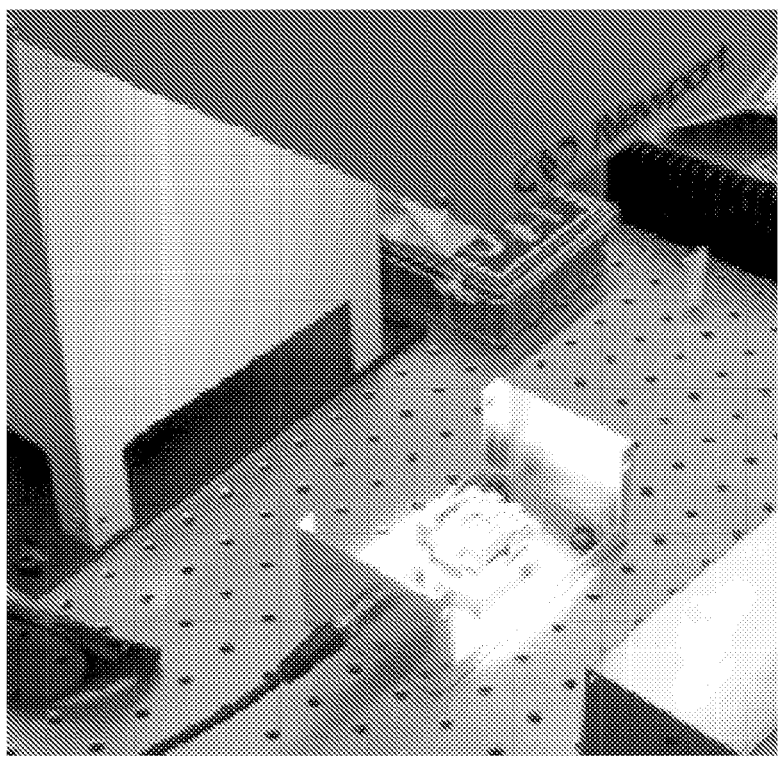

The measurements rely on two-point measurements between the p-n heterojunctions. A voltage is sourced using a KEITHLEY 2400 source meter between the front finger and rear contacts for the lamellar p-n heterojunction device. The current is simultaneously measured between the same two contacts. The electrical measurement is carried out in the dark and under a solar simulator (Newport) that provides an AM 1.5 spectrum with a power density of 100 mW/cm² (1 sun), as shown in FIGS. 12A-12B.

The spot size of the light output from the solar simulator completely illuminates the 1 cm×1 cm solar cell. This is because the socket that houses the p-n heterojunction solar cell has a defined 0.7 cm×0.7 cm opening (as shown in FIG. 12A). In addition, a "control" device consisting of a polycrystalline planar p-n heterojunction can be tested in a similar fashion. The "control" device is formed by crystallizing magnesium silicide or β-iron silicide onto a lightly doped p-type silicon wafer. This allows direct comparison between the lamellar p-n heterojunctions and planar heterojunctions.

The open circuit voltage, $V_{OC}$, short circuit current, $I_{SC}$, and fill factor, FF are easily obtained by this measurement. Finally, the efficiency, $$\eta = \frac{FFV_{oc}I_{sc}}{100 \text{ mWcm}^{-2} \cdot A},$$

where A is the illuminated area (in this case, 0.7 cm×0.7 cm), is calculated.

Wavelength Dependent Measurements of IQE

Wavelength dependent measurements of the IQE can provide information on the theoretical maximum efficiency for the lamellar composites. The IQE is calculated by measuring the external quantum efficiency (EQE) and the reflectance of the lamellar p-n heterojunction solar cell, $R_{Si}$ through the relation: $IQE=EQE-R_{Si}$. The EQE is found by measuring the short circuit current and is given by:

$$EQE = \frac{I_{SC}(\lambda)}{qN(\lambda) \cdot A}$$

where $I_{SC}(\lambda)$ is the wavelength dependent short circuit current, q is the electronic charge, and $N(\lambda)$ is the wavelength dependent number of photons per second per area. A monochromator available at NIST can allow for the wavelength dependent measurements of IQE.

Confirmation that a eutectic composite (formed by eutectic solidification having a lamellar morphology) exhibits as a photovoltaic device. In FIG. 13, current-voltage data is obtained on a lamellar eutectic heterojunction composite of $Mg_2Si$ and Si that is sliced into a wafer (from the ingot shown in FIG. 8C). The data is obtained by placing tungsten probe tips onto the top surface of a sliced wafer from the composite, namely onto two adjacent $Mg_2Si$ and Si phases (inset). Thus, one probe tip is placed onto the $Mg_2Si$ phase and the other onto the Si phase. The measurements are carried out in the dark (1310) and under a lamp (1320). Dark and light measurements indicate a photovoltaic effect, albeit with small short current since the contacts only probe a small section of the entire wafer (FIG. 13).

The present technology is applicable to a broad array of materials and applications. In certain preferred variations, the present technology provides materials comprising a eutectic composition for use as highly efficient solar or photovoltaic cells. The development of silicon-silicide heterojunctions with nanoscale lamellar morphology, in accordance with certain aspects of the present teachings, allows for the efficient extraction of minority carriers. This can eliminate costly purification steps and ultimately lower the cost of solar cells below $1/W, while maintaining efficiencies above 15%.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A material for a photovoltaic cell comprising a eutectic or near-eutectic composition having a first phase comprising silicon (Si) and a second phase comprising a metal silicide, wherein the first phase and the second phase respectively comprise orthogonal domains that together define a lamellar architecture in the material and form a lamellar heterojunction between the first phase and the second phase.

2. The material of claim 1, wherein the metal is an element selected from Groups 2, 3-12, or 13-15 of the IUPAC Periodic Table of Elements.

3. The material of claim 1, wherein the metal is an element selected from the group consisting of: calcium (Ca), cadmium (Cd), cerium (Ce), cobalt (Co), chromium (Cr), iron (Fe), magnesium (Mg), molybdenum (Mo), manganese (Mn), sodium (Na), tin (Sn), zinc (Zn), zirconium (Zr), and combinations thereof.

4. The material of claim 1, wherein the metal is an element selected from the group consisting of: magnesium (Mg) and iron (Fe).

5. The material of claim 1, wherein the eutectic or near-eutectic composition comprises magnesium at greater than or equal to about 40 weight % to less than or equal to about 45 weight % and silicon at greater than or equal to about 55 weight % to less than or equal to about 60 weight %.

6. The material of claim 1, wherein the eutectic or near-eutectic composition comprises magnesium at greater than or equal to about 43 weight % to less than or equal to about 44 weight % and silicon at greater than or equal to about 56 weight % to less than or equal to about 57 weight %.

7. The material of claim 1, wherein the metal comprises magnesium and the metal silicide is magnesium silicide ($Mg_2Si$).

8. The material of claim 1, wherein the eutectic or near-eutectic composition comprises iron at greater than or equal to about 42 weight % to less than or equal to about 48 weight % and silicon at greater than or equal to about 52 weight % to less than or equal to about 58 weight %.

9. The material of claim 1, wherein the eutectic or near-eutectic composition comprises iron at greater than or equal to about 44 weight % to less than or equal to about 46 weight % and silicon at greater than or equal to about 54 weight % to less than or equal to about 56 weight %.

10. The material of claim 1, wherein the metal comprises iron and the metal silicide is β-iron silicide (Si-β-$FeSi_2$).

11. The material of claim 1, wherein the first phase comprising silicon is an n-type material and the second phase comprising a metal silicide is a p-type material.

12. A method of making a material for a photovoltaic cell comprising:
heating a mixture comprising a first material comprising silicon (Si) and a second material comprising a metal to a temperature that is greater than or equal to a eutectic point temperature or a eutectoid point temperature for the mixture so as to melt the metal, wherein the mixture comprises silicon and metal in amounts of a eutectic composition or a near-eutectic composition; and
cooling the mixture to form a eutectic or near-eutectic composition comprising a first phase comprising silicon and a second phase comprising a metal silicide, wherein the first phase and the second phase respectively comprise orthogonal domains that together define a lamellar architecture in the eutectic or near-eutectic composition and form a lamellar heterojunction between the first phase and the second phase.

13. The method of claim 12, wherein the first material comprises silicon at greater than or equal to about 98% by weight of the first material and a second material comprising a metal at greater than or equal to about 98% by weight of the second material.

14. The method of claim 13, wherein the first material is a metallurgical grade silicon.

15. The method of claim 12, wherein the metal is an element selected from the group consisting of: magnesium (Mg) and iron (Fe).

16. The method of claim 12, wherein the metal comprises magnesium and the eutectic point temperature for the mixture is about 945.6° C. and the mixture is heated to a temperature above the eutectic point prior to the cooling.

17. The method of claim 16, wherein the metal comprises magnesium and the metal silicide is magnesium silicide ($Mg_2Si$).

18. The method of claim 12, wherein the metal comprises iron and the eutectoid point temperature for the mixture is about 937° C. and the mixture is heated to a temperature above the eutectoid point prior to the cooling.

19. The method of claim 18, wherein the metal comprises iron and the metal silicide is β-iron silicide (Si-β-$FeSi_2$).

20. A method of generating an electric current comprising:
illuminating a photovoltaic cell, the photovoltaic cell comprising a material comprising a eutectic or a near-eutectic composition having a first n-type phase comprising silicon (Si) and a second p-type phase comprising a metal silicide, wherein the first phase and the second phase respectively comprise orthogonal domains that together define a lamellar architecture in the material and form a lamellar heterojunction between the first phase and the second phase, wherein the photovoltaic cell is coupled to an electrical circuit.

21. The method of claim 20, wherein the metal comprises magnesium and the metal silicide is magnesium silicide ($Mg_2Si$).

22. The method of claim 20, wherein the metal comprises iron and the metal silicide is β-iron silicide (Si-β-$FeSi_2$).

* * * * *